United States Patent
Sawachi et al.

(10) Patent No.: US 10,665,430 B2
(45) Date of Patent: May 26, 2020

(54) GAS SUPPLY SYSTEM, SUBSTRATE PROCESSING SYSTEM AND GAS SUPPLY METHOD

(71) Applicant: TOKYO ELECTRON LIMITED, Tokyo (JP)

(72) Inventors: Atsushi Sawachi, Miyagi (JP); Norihiko Amikura, Miyagi (JP); Kouji Nishino, Osaka (JP); Yohei Sawada, Osaka (JP); Yoshiharu Kishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 331 days.

(21) Appl. No.: 15/645,521

(22) Filed: Jul. 10, 2017

(65) Prior Publication Data

US 2018/0012735 A1 Jan. 11, 2018

(30) Foreign Application Priority Data

Jul. 11, 2016 (JP) .................................. 2016-136782
Jan. 25, 2017 (JP) .................................. 2017-011378

(51) Int. Cl.
*H01J 37/32* (2006.01)
*F16K 7/12* (2006.01)
(Continued)

(52) U.S. Cl.
CPC .......... *H01J 37/32449* (2013.01); *F16K 7/12* (2013.01); *F16K 7/123* (2013.01);
(Continued)

(58) Field of Classification Search
CPC .......... H01J 37/32449; H01J 37/32091; H01J 37/3244; H01J 37/32165; H01J 2237/334;
(Continued)

(56) References Cited

U.S. PATENT DOCUMENTS 5,224,510 A * 7/1993 Pericles ................ F16K 31/004
137/341
6,017,395 A * 1/2000 Matuno ............. C23C 16/45557
118/715

(Continued)

FOREIGN PATENT DOCUMENTS

WO 2015/064035 A1 5/2015

*Primary Examiner* — Jeffrie R Lund
(74) *Attorney, Agent, or Firm* — Studebaker & Brackett PC

(57) ABSTRACT

A gas supply system includes: a first flow channel connecting a first gas source and a chamber; a second flow channel connecting a second gas source and the first flow channel; a control valve, provided in the second flow channel, configured to control a flow rate of the second gas; an orifice provided downstream of the control valve and at a terminus of the second flow channel; a switching valve, provided at a connection point between the first flow channel and the terminus of the second flow channel, configured to control a supply timing of the second gas; an exhaust mechanism, connected to a flow channel between the control valve and the orifice in the second flow channel, configured to exhaust the second gas; and a controller configured to bring the control valve, the switching valve and the exhaust mechanism into operation.

15 Claims, 29 Drawing Sheets

(51) Int. Cl.
*F16K 31/00* (2006.01)
*G05D 7/06* (2006.01)
*G05D 11/13* (2006.01)
*H01L 21/67* (2006.01)
*H01L 21/3065* (2006.01)
*C23C 16/455* (2006.01)

(52) U.S. Cl.
CPC ......... *F16K 31/004* (2013.01); *G05D 7/0635* (2013.01); *G05D 11/133* (2013.01); *H01J 37/3244* (2013.01); *H01J 37/32091* (2013.01); *H01J 37/32165* (2013.01); *H01L 21/67017* (2013.01); *C23C 16/45561* (2013.01); *H01J 2237/334* (2013.01); *H01L 21/3065* (2013.01); *H01L 21/67069* (2013.01)

(58) Field of Classification Search
CPC .......... F16K 7/12; F16K 31/004; F16K 7/123; H01L 21/67017; H01L 21/67069; H01L 21/3065; G05D 7/0635; G05D 11/133; C23C 16/45561
See application file for complete search history.

(56) References Cited

U.S. PATENT DOCUMENTS

| | | | | |
|---|---|---|---|---|
| 9,010,369 | B2* | 4/2015 | Ohmi | G01F 1/363 137/599.07 |
| 9,841,770 | B2* | 12/2017 | Hirata | G05D 7/0641 |
| 10,386,863 | B2* | 8/2019 | Hirata | F16K 7/14 |
| 2011/0315905 | A1* | 12/2011 | Hirose | F15D 1/025 251/12 |
| 2014/0151464 | A1* | 6/2014 | Cheng | E03C 1/046 239/313 |
| 2016/0252913 | A1 | 9/2016 | Hirata et al. | |
| 2016/0274595 | A1* | 9/2016 | Ohmi | G01F 1/6847 |
| 2016/0327963 | A1* | 11/2016 | Hirata | G05D 7/0641 |
| 2016/0349763 | A1* | 12/2016 | Hirose | G05D 7/0635 |
| 2017/0212531 | A1* | 7/2017 | Nagase | G05D 7/0635 |
| 2018/0012735 | A1* | 1/2018 | Sawachi | F16K 7/123 |
| 2019/0138033 | A1* | 5/2019 | Sawachi | C23C 16/45561 |
| 2019/0164725 | A1* | 5/2019 | Kawakami | H01J 37/32229 |
| 2019/0178389 | A1* | 6/2019 | Sawada | G05D 7/0635 |
| 2019/0243391 | A1* | 8/2019 | Hirata | H01L 21/67017 |

* cited by examiner

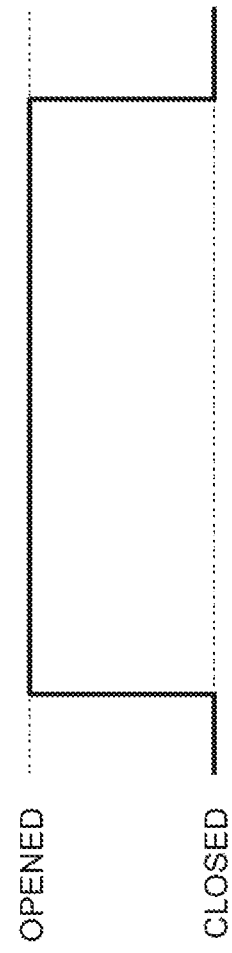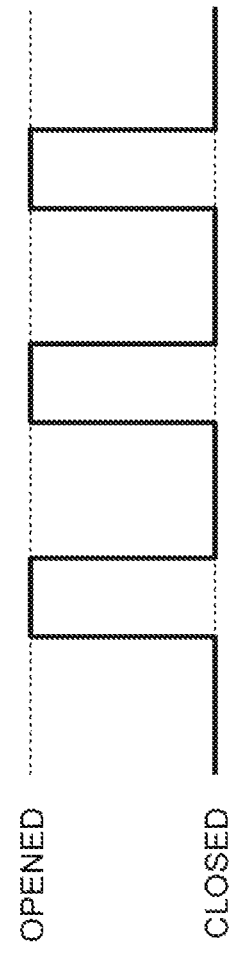

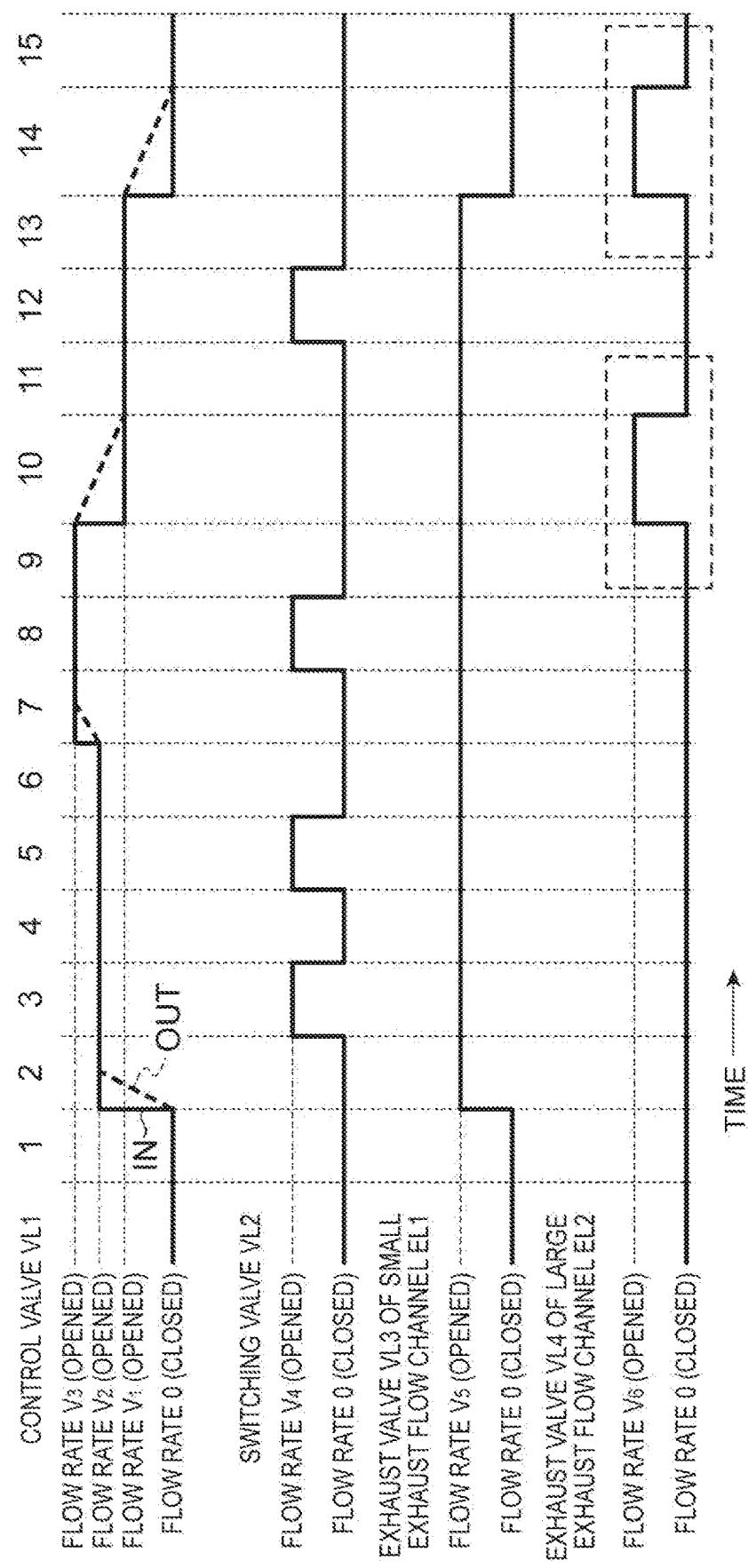

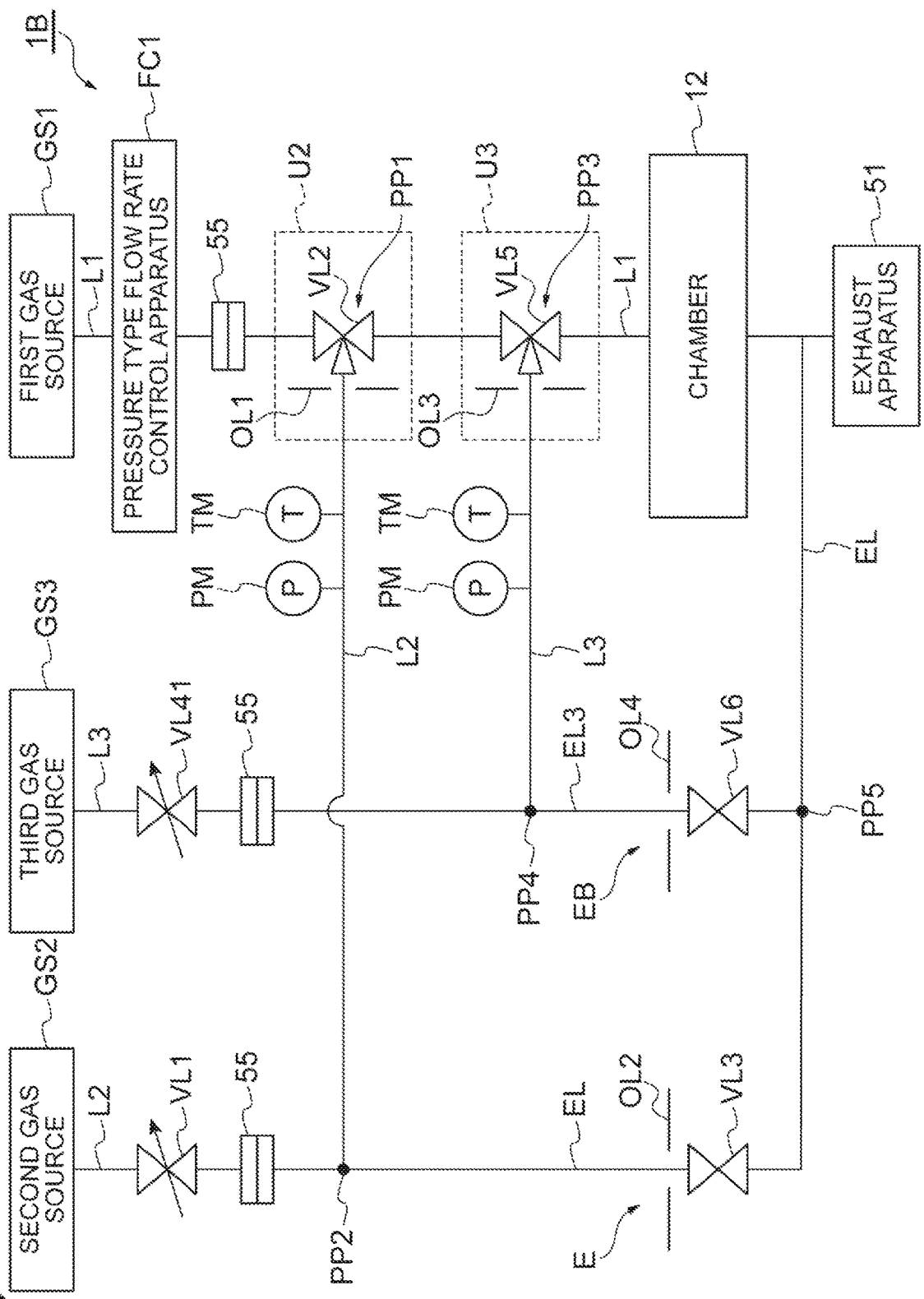

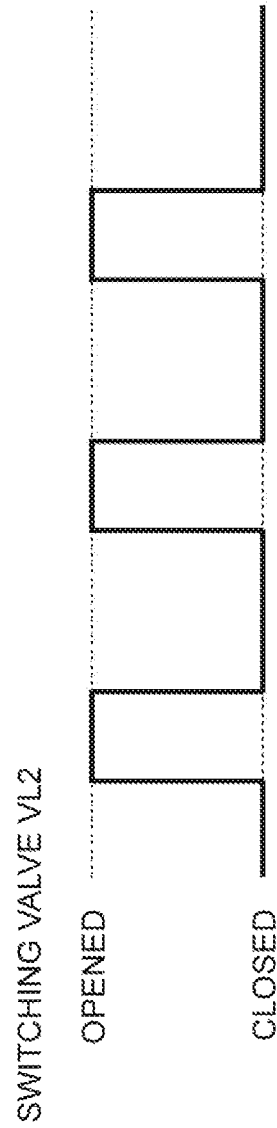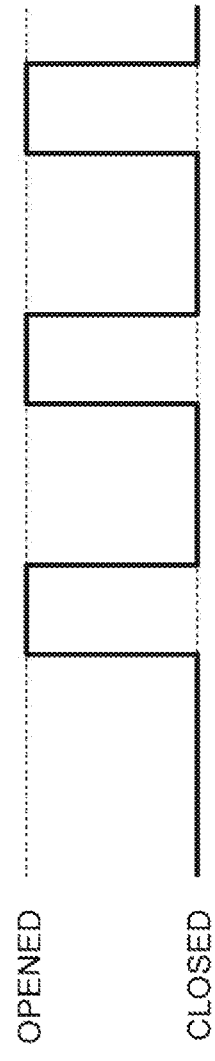

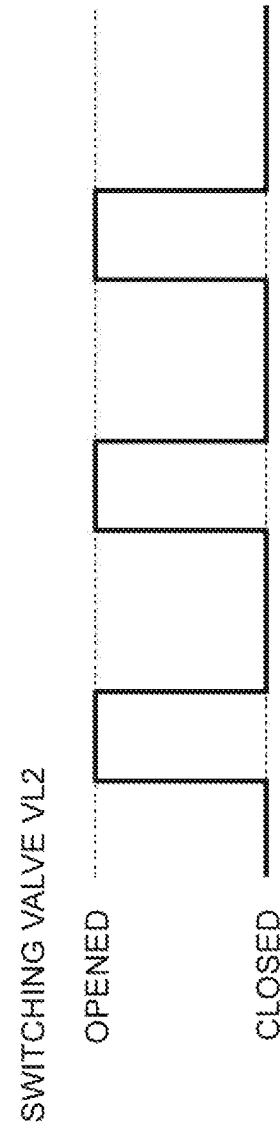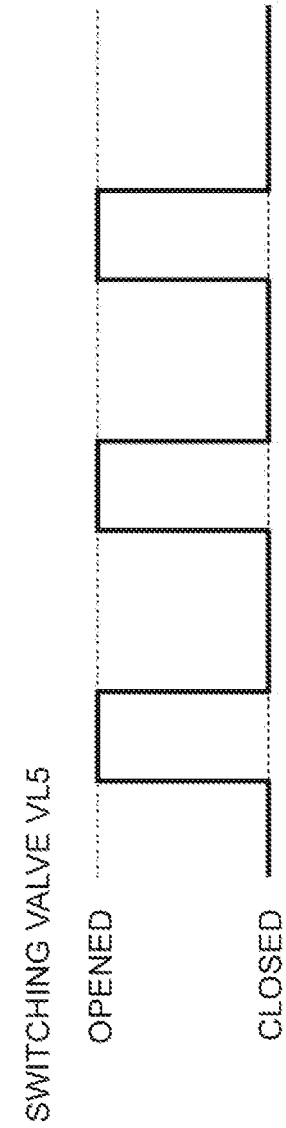

*Fig. 12A*

| RECIPE (CONTROLLER SIDE) | STEP 1 | STEP 2 | STEP 3 | STEP 4 | STEP 5 | STEP 6 | STEP 7 | STEP 8 |
|---|---|---|---|---|---|---|---|---|
| Ar [sccm] | 800 | 800 | 1500 | 1500 | 1500 | 1500 | 1500 | 1500 |
| O₂ [sccm] | 0 | 0 | 6 | 0 | 6 | 0 | 0 | 0 |
| C₄F₆ [sccm] | 0 | 0 | 7.5 | 0 | 7.5 | 0 | 0 | 5.5 |

*Fig. 12B*

| INPUT TO CONTROL CIRCUIT | STEP 1 | STEP 2 | STEP 3 | STEP 4 | STEP 5 | STEP 6 | STEP 7 | STEP 8 |
|---|---|---|---|---|---|---|---|---|
| Ar [sccm] | 800 | 800 | 1500 | 1500 | 1500 | 1500 | 1500 | 1500 |
| O₂ [sccm] | 0 | 6 | 6 | 6 | 6 | 0 | 0 | 0 |
| C₄F₆ [sccm] | 0 | 7.5 | 7.5 | 7.5 | 7.5 | 0 | 5.5 | 5.5 |

Fig. 13A

| CONTROLLER PROCESS | STEP N-2 | STEP N-1 | STEP N | STEP N+1 |
|---|---|---|---|---|
| RECIPE INPUT [sccm] | 0 | 0 | α | 0 |
| TARGET SETTING [sccm] | 0 | α | α | 0 |
| CONTROLLER VALVE | CLOSED | OPENED | OPENED | CLOSED |
| SWITCHING VALVE | CLOSED | CLOSED | OPENED | CLOSED |
| EXHAUST VALVE | CLOSED | OPENED | OPENED | CLOSED |

Fig. 13B

| CONTROL CIRCUIT PROCESS | STEP N-2 | STEP N-1 | STEP N | STEP N+1 |
|---|---|---|---|---|
| INPUT [sccm] | 0 | α | α | 0 |
| CONTROL VALVE | CLOSED | SELF-CONTROL | SELF-CONTROL | CLOSED |
| EXHAUST VALVE (SMALL FLOW RATE/LARGE FLOW RATE) | CLOSED | SELF-CONTROL | SELF-CONTROL | CLOSED |

Fig. 14A

| CONTROLLER PROCESS | STEP N-2 | STEP N-1 | STEP N | STEP N+1 | STEP N+2 |
|---|---|---|---|---|---|
| RECIPE INPUT [sccm] | 0 | 0 | α | β | 0 |
| TARGET SETTING [sccm] | 0 | α | α | β | 0 |
| CONTROLLER VALVE | CLOSED | OPENED | OPENED | OPENED | CLOSED |
| SWITCHING VALVE | CLOSED | CLOSED | OPENED | OPENED | CLOSED |
| EXHAUST VALVE | CLOSED | OPENED | OPENED | OPENED | CLOSED |

Fig. 14B

| CONTROL CIRCUIT PROCESS | STEP N-2 | STEP N-1 | STEP N | STEP N+1 | STEP N+2 |
|---|---|---|---|---|---|
| INPUT [sccm] | 0 | α | α | β | 0 |
| CONTROL VALVE | CLOSED | SELF-CONTROL | SELF-CONTROL | SELF-CONTROL | CLOSED |
| EXHAUST VALVE (SMALL FLOW RATE/ LARGE FLOW RATE) | CLOSED | SELF-CONTROL | SELF-CONTROL | SELF-CONTROL | CLOSED |

Fig.15A

| CONTROLLER PROCESS | STEP N-2 | STEP N-1 | STEP N | STEP N+1 | STEP N+2 | STEP N+3 |
|---|---|---|---|---|---|---|
| RECIPE INPUT [sccm] | 0 | 0 | $\alpha$ | 0 | $\beta$ | 0 |
| TARGET SETTING [sccm] | 0 | $\alpha$ | $\alpha$ | $\beta$ | $\beta$ | 0 |
| CONTROLLER VALVE | CLOSED | OPENED | OPENED | OPENED | OPENED | CLOSED |
| SWITCHING VALVE | CLOSED | CLOSED | OPENED | CLOSED | OPENED | CLOSED |
| EXHAUST VALVE | CLOSED | OPENED | OPENED | OPENED | OPENED | CLOSED |

Fig.15B

| CONTROL CIRCUIT PROCESS | STEP N-2 | STEP N-1 | STEP N | STEP N+1 | STEP N+2 | STEP N+3 |
|---|---|---|---|---|---|---|
| INPUT [sccm] | 0 | $\alpha$ | $\alpha$ | $\beta$ | $\beta$ | 0 |
| CONTROL VALVE | CLOSED | SELF-CONTROL | SELF-CONTROL | SELF-CONTROL | SELF-CONTROL | CLOSED |
| EXHAUST VALVE (SMALL FLOW RATE/ LARGE FLOW RATE) | CLOSED | SELF-CONTROL | SELF-CONTROL | SELF-CONTROL | SELF-CONTROL | CLOSED |

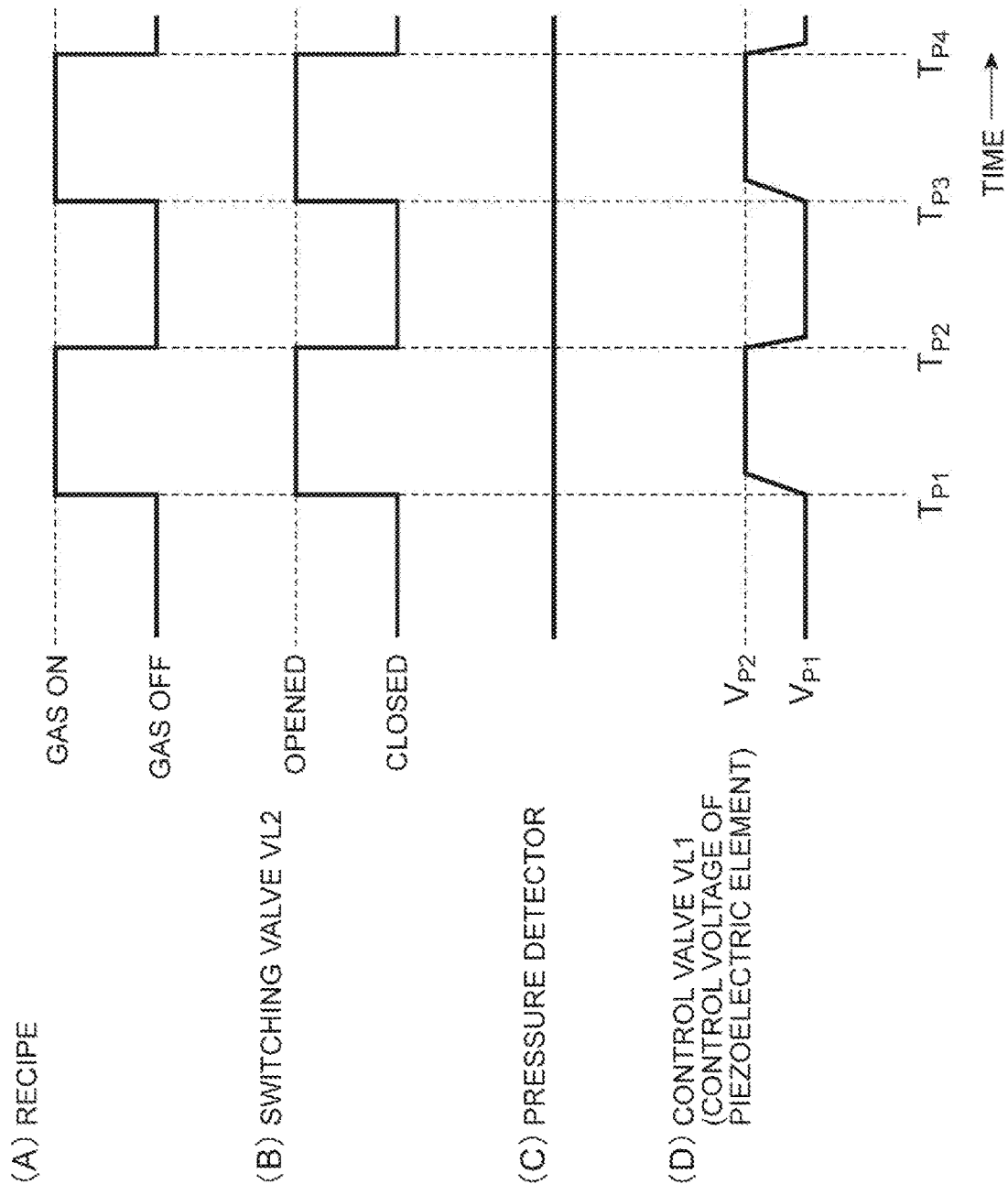

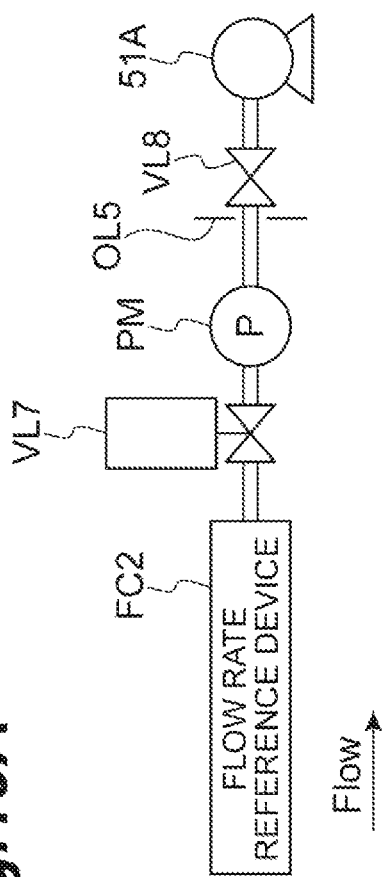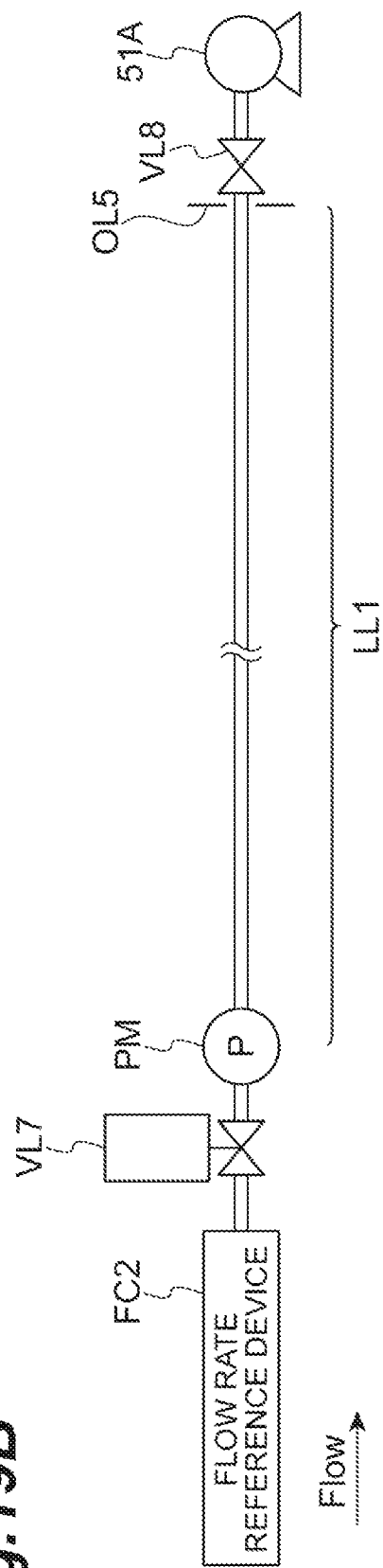

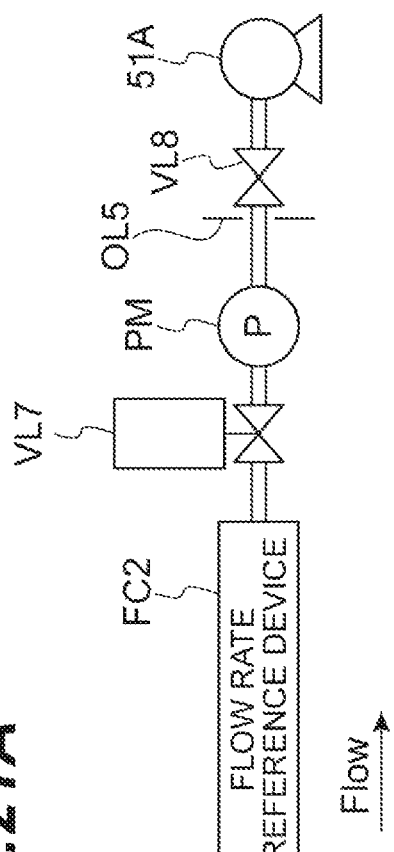
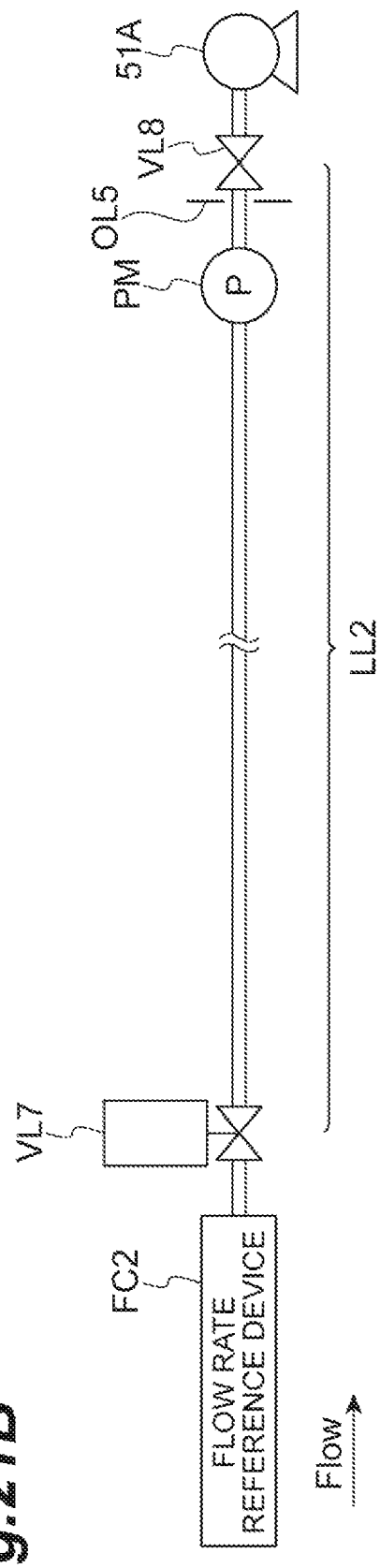

Fig.27

| AREA | | AREA DEPENDENCY | | DEGREE OF INFLUENCE | |
|---|---|---|---|---|---|
| | | RISING (0→90%) | FALLING (100→20%) | RISING | FALLING |
| A | FLOW RATE CONTROL DEVICE RESPONSIVENESS | [graph] | [graph] | 13% | 0% |
| B | ADD LINE LENGTH | [graph] | [graph] | 54% | 72% |
| C | MAIN LINE LENGTH | [graph] | [graph] | 4% | 4% |
| D | UPPER ELECTRODE CAPACITY | [graph] | [graph] | 25% | 20% |
| E | NUMBER OF GAS HOLES | [graph] | [graph] | 4% | 4% |

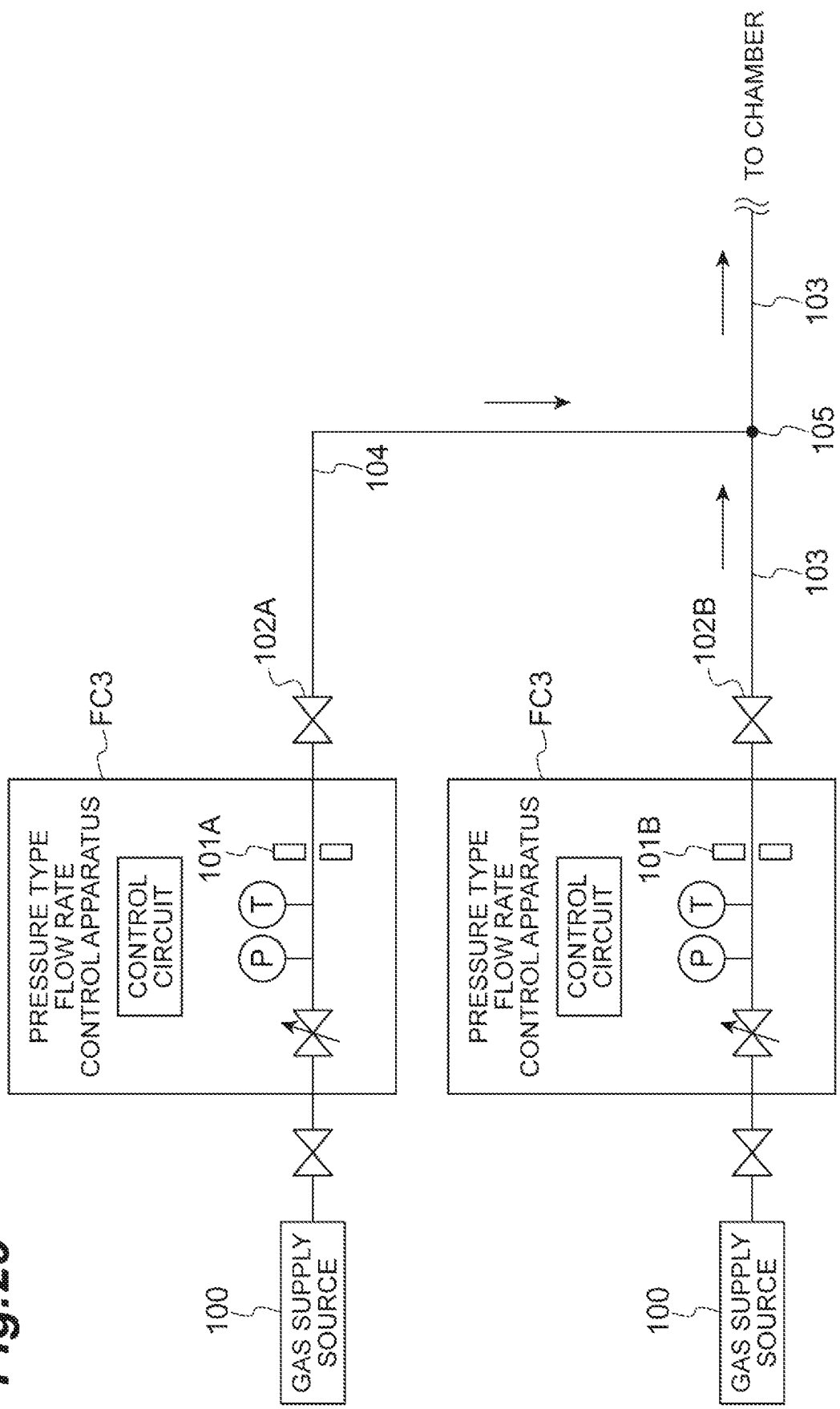

GAS SUPPLY SYSTEM, SUBSTRATE PROCESSING SYSTEM AND GAS SUPPLY METHOD

CROSS-REFERENCE TO RELATED APPLICATIONS

This application is based on and claims the benefit of priority from Japanese Patent Application No. P2016-136782 filed on Jul. 11, 2016 and No. 2017-011378 filed on Jan. 25, 2017, and the entire contents of which are incorporated herein by reference.

BACKGROUND

Field

Exemplary embodiments of the present disclosure relates to a gas supply system, a substrate processing system and a gas supply method.

Related Background Art

PCT International Publication No. WO2015/064035 discloses a pressure type flow rate control apparatus. The pressure type flow rate control apparatus includes a control valve that controls a flow rate of a gas to a predetermined amount, an orifice which is provided downstream of the control valve, a temperature sensor and a pressure sensor which are disposed between the control valve and the orifice, and a control circuit that controls the switching amount of the control valve on the basis of a sensor detection value and a target value. In the pressure type flow rate control apparatus, a flow rate subject to temperature correction is calculated by the control circuit on the basis of the sensor detection value. The calculated flow rate and the target value are compared with each other by the control circuit, and the control valve is controlled so that a difference therebetween decreases.

SUMMARY

In first aspect, there is provided a gas supply system for supplying a gas to a chamber of a substrate processing apparatus, the system including: a first flow channel connecting a first gas source of a first gas and the chamber; a second flow channel connecting a second gas source of a second gas and the first flow channel; a control valve, provided in the second flow channel, configured to control a flow rate of the second gas to a predetermined amount; an orifice provided downstream of the control valve and at a terminus of the second flow channel; a switching valve, provided at a connection point between the first flow channel and the terminus of the second flow channel, configured to control a supply timing of the second gas which is supplied from an outlet of the orifice to the first flow channel; an exhaust mechanism, connected to a flow channel between the control valve and the orifice in the second flow channel, configured to exhaust the second gas; and a controller configured to bring the control valve, the switching valve and the exhaust mechanism into operation.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 5A and 5B are diagrams illustrating switching timings of a secondary valve for a first gas and a switching valve for a second gas.

FIG. 8 is a diagram illustrating flow rates of the second gas passing through a control valve, a switching valve and exhaust valves for the second gas.

FIG. 9 is a schematic diagram of a gas supply system according to an exemplary embodiment.

FIGS. 10A and 10B are diagrams illustrating an example of switching timings of a plurality of switching valves.

FIGS. 11A and 11B are diagrams illustrating another example of switching timing of the plurality of switching valves.

FIGS. 12A and 12B are diagrams illustrating a recipe and an input to a control circuit corresponding to the recipe.

FIGS. 13A and 13B are diagrams illustrating an example of switching control of valves with respect to an input.

FIGS. 14A and 14B are diagrams illustrating another example of switching control of the valves with respect to the input.

FIGS. 15A and 15B are diagrams illustrating another example of switching control of the valves with respect to the input.

FIG. 18 is a diagram illustrating switching confirmation of a switching valve.

FIGS. 19A and 19B are system schematic diagrams when the influence of the detection position of a pressure detector on flow rate control is evaluated.

FIGS. 21A and 21B are system schematic diagrams when the influence of the detection position of the pressure detector on flow rate control is evaluated.

FIG. 27 is evaluation results of each component shown in FIG. 26.

FIG. 29 is a schematic diagram of a gas supply system of the related art.

DETAILED DESCRIPTION

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In a substrate processing process, processing may be performed using a plurality of gases. For example, gases of a plurality of gas sources may be merged with each other to supply the merged gas to a chamber, or a gas used for each step may be switched.

Figure 28:
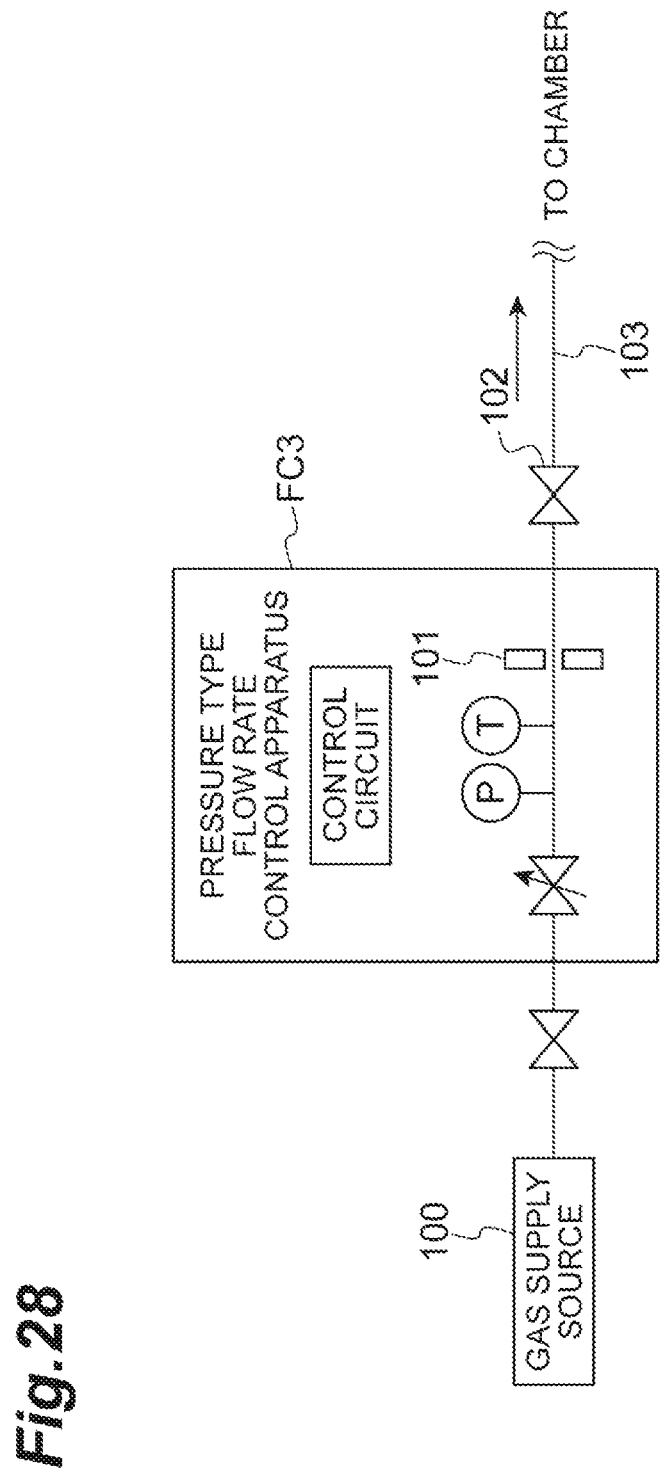
FIG. 28 is a schematic diagram of a gas supply system of the related art.

In order to realize such a process, for example, as shown in FIG. 28, it is considered that a switching valve 102 is disposed on the downstream side of a pressure type flow rate control apparatus FC3 that controls the gas flow rate of a gas supply source 100, and that the switching valve 102 is used in selecting gases to be mixed, or switching a gas to be supplied to a chamber. In addition, for example, as shown in FIG. 29, it is considered that a flow channel 104 of a second gas is merged into a flow channel 103 of a first gas at a connection point 105, to supply a mixed gas to the chamber.

However, in the configuration shown in FIG. 28, a gas remains in a flow channel between an orifice 101 and the switching valve 102 in the flow channel 103 when the switching valve 102 is set to be closed. The pressure and flow rate of such a remaining gas cannot be controlled. Therefore, when the switching valve 102 is set to be opened, the gas is supplied to the chamber in a state where the flow rate is not controlled. In addition, in the configuration shown in FIG. 29, in a case where the pressure of the first gas flowing through the flow channel 103 is higher than the pressure of the second gas flowing through the flow channel 104, there may be a concern that it takes time for the second gas to be filled into a flow channel between a switching valve 102A and the connection point 105. In this manner, a gas supply system has room for its improvement in order to execute a process by controlling a plurality of gases.

In first aspect, there is provided a gas supply system that supplies a gas to a chamber of a substrate processing apparatus, the system including: a first flow channel connecting a first gas source of a first gas and the chamber; a second flow channel connecting a second gas source of a second gas and the first flow channel; a control valve, provided in the second flow channel, configured to control a flow rate of the second gas to a predetermined amount; an orifice provided downstream of the control valve and at a terminus of the second flow channel; a switching valve, provided at a connection point between the first flow channel and the terminus of the second flow channel, configured to control a supply timing of the second gas which is supplied from an outlet of the orifice to the first flow channel; an exhaust mechanism, connected to a flow channel between the control valve and the orifice in the second flow channel, configured to exhaust the second gas; and a controller configured to bring the control valve, the switching valve and the exhaust mechanism into operation.

In the gas supply system according to the first aspect, the orifice is provided downstream of the control valve and at the terminus of the second flow channel, and the switching valve is provided at the connection point between the first flow channel and the terminus of the second flow channel. That is, since the orifice and the switching valve are disposed at the connection point between the first flow channel and the terminus of the second flow channel, it is possible to minimize a flow channel from the orifice to the switching valve. Thereby, when the switching valve is set to be opened, it is possible to prevent a gas remaining in the flow channel from the orifice to the switching valve from being supplied to the chamber in a state where the flow rate thereof is not controlled. Further, since the switching valve is provided at the connection point between the first flow channel and the terminus of the second flow channel, it is possible to minimize a flow channel from the switching valve to the connection point. Thereby, even in a case where the pressure of a gas flowing through the first flow channel is higher than the pressure of a gas flowing through the second flow channel, it is possible to prevent it from taking time for the second gas to filled into a flow channel between the switching valve and the connection point. Further, since the exhaust mechanism that exhausts the second gas is connected to the flow channel between the control valve and the orifice in the second flow channel, for example, the switching valve is set to be closed, and the exhaust mechanism is brought into operation, whereby the flow channel between the control valve and the orifice can be filled with a gas having a predetermined target pressure in a state where supply to the chamber is stopped. Therefore, it is possible to save a time which will be taken until the switching valve is set to be opened and then the flow channel between the control valve and the orifice is filled with the gas having a predetermined target pressure, which leads to excellent responsiveness.

In an exemplary embodiment, the switching valve may include a sealing member which is pressed against the orifice so as to seal the outlet of the orifice at the time of closing control, and is separated from the orifice at the time of opening control. With such a configuration, it is possible to switch the outlet of the orifice.

In an exemplary embodiment, the switching valve may include a cylinder configured to fixedly support the sealing member, an urging member configured to elastically urge the cylinder in a direction in which the sealing member is pressed against the orifice, and a driving portion that moves the cylinder in a direction opposite to the pressed direction. In a case of such a configuration, the driving portion moves the sealing member pressed against the orifice by the urging member through the cylinder in a direction opposite to the pressed direction, and thus can set the outlet of the orifice to be opened.

In an exemplary embodiment, the orifice and the switching valve may be disposed further downstream than an inlet block provided to the chamber. The orifice and the switching valve are located on the side located further downstream than the inlet block, that is, the chamber side rather than the inlet block, it is possible to perform gas control at a position closer to the chamber as compared to a case of the locations thereof on the side located further upstream than the inlet block. Thus, it is possible to improve the responsiveness of gases which are supplied to the chamber.

In an exemplary embodiment, the orifice and the switching valve may be disposed further upstream than the inlet block provided to the chamber. In a case of such a configuration, since components located from the control valve to the switching valve can be unitized, it is easy to handle the respective components.

In an exemplary embodiment, the exhaust mechanism may include: a small exhaust flow channel, connected to the second flow channel, which has a first amount of exhaust; a large exhaust flow channel, connected to the second flow channel, which has a second amount of exhaust larger than the first amount of exhaust; and a first exhaust valve, provided in the large exhaust flow channel, configured to control an exhaust timing. In a case of such a configuration, since the exhaust timing can be controlled for each exhaust flow channel, it is possible to finely adjust pressure in the flow channel between the control valve and the orifice.

In an exemplary embodiment, the exhaust mechanism may further include a second exhaust valve, provided in the small exhaust flow channel, configured to control an exhaust timing. In a case of such a configuration, since the exhaust timing can be controlled for each exhaust flow channel, it is possible to more finely adjust pressure in the flow channel between the control valve and the orifice.

In an exemplary embodiment, the exhaust mechanism may be connected to the orifice side in the flow channel between the control valve and the orifice. In a case of such a configuration, it is possible to further reduce an error of pressure adjustment than in a case where the exhaust mechanism is connected to the control valve side in the flow channel between the control valve and the orifice.

In an exemplary embodiment, the gas supply system may further include a pressure detector configured to detect a pressure of the second gas in the flow channel between the control valve and the orifice in the second flow channel, the pressure detector may be located on the orifice side in the flow channel between the control valve and the orifice, and the control valve may control the flow rate of the second gas on the basis of a detection result of the pressure detector. In a case of such a configuration, it is possible to further reduce an error of flow rate adjustment than in a case where the pressure detector is located on the control valve side in the flow channel between the control valve and the orifice.

In an exemplary embodiment, the gas supply system may further include a temperature detector that detects a temperature of the second gas in the flow channel between the control valve and the orifice in the second flow channel, the temperature detector may be located on the orifice side in the flow channel between the control valve and the orifice, and the control valve may control the flow rate of the second gas on the basis of a detection result of the temperature detector. In a case of such a configuration, it is possible to further reduce an error of flow rate adjustment than in a case where the temperature detector is located on the control valve side in the flow channel between the control valve and the orifice.

In an exemplary embodiment, in a case where the second gas of a target flow rate is supplied to the first flow channel at a target supply timing, the controller may control the control valve to circulate the second gas of the target flow rate in a state where the exhaust mechanism is brought into operation while the switching valve is set to be closed in a predetermined period until arrival at the target supply timing, and set the switching valve to be opened at the time of arrival at the target supply timing. With such a configuration, it is possible to save a time which will be taken until the switching valve is set to be opened and then the flow channel between the control valve and the orifice is filled with the gas having a predetermined target pressure, which leads to excellent responsiveness.

In an exemplary embodiment, the gas supply system may further include a control unit configured to acquire a control value of the control valve, the control valve may include a valve body, a valve seat, and a piezoelectric element configured to expand in accordance with a control voltage and perform switching of the control valve by the valve body and the valve seat being brought close to or separated from each other, and the control unit may determine switching of the switching valve on the basis of a control voltage of the piezoelectric element. The operation of gas supply can be confirmed using a control pressure value, but it is difficult to determine the normal operation of gas supply in a case where a certain amount of flow rate is output at all times. A method is also considered in which an actuator of the switching valve is provided with a magnetic proximity sensor or the like and the switching of the switching valve is determined, but the number of components increases, which leads to a complicated configuration. In such a gas supply system, the piezoelectric element of the control valve operates so as to follow the switching of the switching valve. Therefore, the control voltage of the piezoelectric element of the control valve is used, and thus it is possible to easily determine the switching of the valve.

In an exemplary embodiment, the control unit may compare the acquired control voltage with a reference value of the predetermined control voltage, and output a warning in accordance with a comparison result. With such a configuration, it is possible to output a warning when the switching valve does not perform a predetermined operation.

In second aspect, there is provided a substrate processing system including the above-described gas supply system, and thus it is possible to treat a substrate using the above-described gas supply system.

In third aspect, there is provided a method for supplying a gas to a chamber of a substrate processing apparatus using a gas supply system including a first flow channel connecting a first gas source of a first gas and the chamber, a second flow channel connecting a second gas source of a second gas and the first flow channel, a control valve, provided in the second flow channel, configured to control a flow rate of the second gas to a predetermined amount, an orifice provided downstream of the control valve and at a terminus of the second flow channel, a switching valve, provided at a connection point between the first flow channel and the terminus of the second flow channel, configured to control a supply timing of the second gas which is supplied from an outlet of the orifice to the first flow channel, an exhaust mechanism, connected to a flow channel between the control valve and the orifice in the second flow channel, configured to exhaust the second gas, and a controller configured to bring the control valve, the switching valve and the exhaust mechanism into operation, the method including the steps of: controlling the control valve to circulate the second gas of a target flow rate in a state where the exhaust mechanism is brought into operation while the switching valve is set to be closed; and setting the switching valve to be opened and supplying the second gas of the target flow rate to the first flow channel at the time of arrival at a target supply timing during continuation of the step of controlling.

According to the gas supply method of third aspect, the same effect as that of the above-described gas supply system is exhibited.

According to various aspects and the exemplary embodiments, it is possible to provide a gas supply system improved in order to execute a process by controlling a plurality of gases.

Hereinafter, various exemplary embodiments will be described in detail with reference to accompanying drawings. Meanwhile, like elements in respective drawings will be denoted by like reference numerals.

First Exemplary Embodiment

Figure 1:
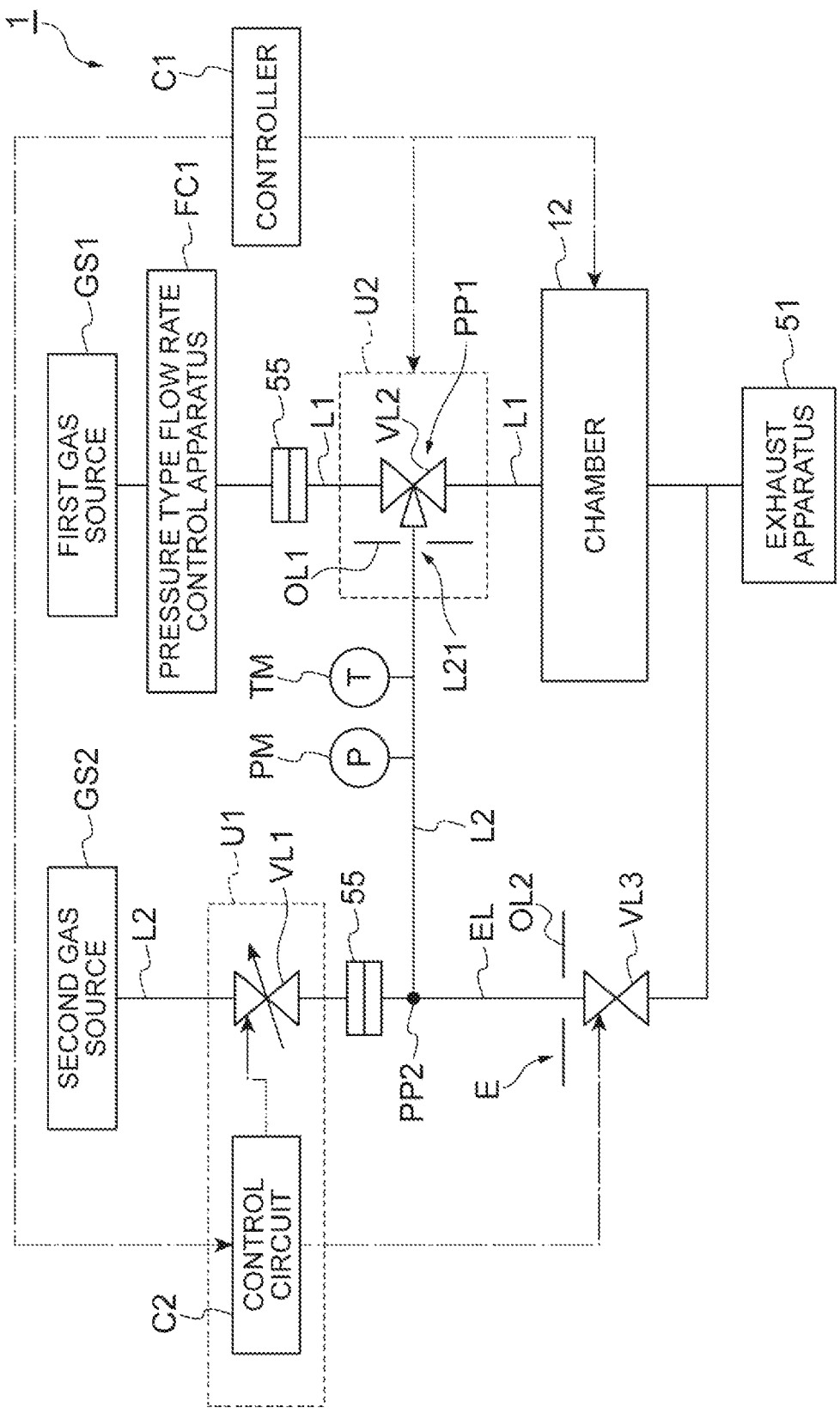
FIG. 1 is a schematic diagram of a gas supply system according to an exemplary embodiment.

FIG. 1 is a schematic diagram of a gas supply system 1 according to a first exemplary embodiment. The gas supply system 1 shown in FIG. 1 is a system that supplies gases to a chamber 12 of a substrate processing apparatus. The gas supply system 1 includes a first flow channel L1 and a second flow channel L2. The first flow channel L1 connects a first gas source GS1 of a first gas and the chamber 12. The second flow channel connects a second gas source GS2 of a second gas and the first flow channel L1. The second flow channel L2 is merged with the first flow channel L1 at a connection point PP1. The first flow channel L1 and the second flow channel L2 are formed by, for example, piping. The first gas may be supplied to the chamber 12 at a larger flow rate than the second gas. The first gas and the second gas are arbitrary. The first gas may be a carrier gas as an example. The carrier gas is, for example, an Ar gas, an $N_2$ gas, or the like.

A pressure type flow rate control apparatus FC1 may be disposed on the downstream side of the first gas source GS1 in the first flow channel L1 and the upstream side of the connection point with the second flow channel L2. A primary valve which is not shown is provided on the upstream side of the pressure type flow rate control apparatus FC1, and a secondary valve which is not shown is provided on the downstream side of the pressure type flow rate control apparatus FC1. The pressure type flow rate control apparatus FC1 includes a control valve, a pressure detector, a temperature detector, an, orifice, and the like. The control valve is provided downstream of the primary valve. The orifice is provided downstream of the control valve and upstream of the secondary valve. In addition, the pressure detector and the temperature detector are configured to measure pressure and temperature in a flow channel between the control valve and the orifice. The pressure type flow rate control apparatus FC1 controls the control valve in accordance with the pressure and the temperature measured by the pressure detector and the temperature detector, and thus adjusts the pressure of a flow channel located upstream of the orifice. In a case where a so-called critical expansion condition of $P_1/P_2 \geq$ approximately 2 is held between upstream-side pressure $P_1$ and downstream-side pressure $P_2$ of the orifice, a gas flow rate Q circulating through the orifice is set to $Q=KP_1$ (where, K is a constant). In addition, in a case where the critical expansion condition is not satisfied, the gas flow rate Q circulating through the orifice is set to $Q=KP_2{}^m(P_1-P_2)^n$ (where, K, m, and n are constants). Therefore, it is possible to control the gas flow rate Q with a high degree of accuracy by controlling the upstream-side pressure $P_1$. Furthermore, even in a case where the pressure of an upstream-side gas of the control valve changes greatly, it is possible to exhibit excellent characteristics of little change in control flow rate value. The first gas of the first gas source GS1 has its flow rate adjusted by the pressure type flow rate control apparatus FC1, and is supplied to the chamber 12 through the connection point PP1 with the second flow channel L2.

A control valve VL1, an orifice OL1, a switching valve VL2 are disposed in this order on the downstream side of the second gas source GS2 in the second flow channel L2.

The control valve VL1 is provided in the second flow channel L2, and controls the flow rate of the second gas to a predetermined amount. The control valve VL1 has the same function as that of the control valve included in the pressure type flow rate control apparatus FC1. The pressure and the temperature of a flow channel between the control valve VL1 and the orifice OL1 may be detected by a pressure detector PM and a temperature detector TM.

The pressure detector PM detects the pressure of the second gas in the flow channel between the control valve VL1 and the orifice OL1 in the second flow channel L2. The pressure detector PM may be located on the orifice OL1 side in the flow channel between the control valve VL1 and the orifice OL1. That is, the length of a flow channel between the pressure detector PM and the orifice OL1 may be smaller than the length of a flow channel between the control valve VIA and the pressure detector PM. In the flow channel between the control valve VL1 and the orifice OL1, the pressure detector PM is located on the orifice OL1 side, and thus it is possible to further reduce an error of flow rate adjustment than in a case where the pressure detector is located on the control valve side.

The temperature detector TM detects the temperature of the second gas in the flow channel between the control valve VL1 and the orifice OL1 in the second flow channel L2. The temperature detector TM may be located on the orifice OL1 side in the flow channel between the control valve VL1 and the orifice OL1. That is, the length of a flow channel between the temperature detector TM and the orifice OL1 may be smaller than the length of a flow channel between the control valve VL1 and the temperature detector TM. In the flow channel between the control valve VL1 and the orifice OL1, the temperature detector TM is located on the orifice OL1 side, and thus it is possible to further reduce an error of flow rate adjustment than in a case where the temperature detector is located on the control valve side.

The control valve VL1 controls the flow rate of the second gas on the basis of the detection results of the pressure detector PM and the temperature detector TM. As a more specific example, a control circuit C2 determines an operation of the control valve VL1. The control circuit C2 inputs the pressure and the temperature detected by the pressure detector PM and the temperature detector TM, and performs flow rate calculation and temperature correction of the detected pressure. The control circuit C2 compares the set target flow rate and the calculated flow rate, and determines the operation of the control valve VL1 so that the difference therebetween decreases. Meanwhile, the primary valve may be provided between the second gas source GS2 and the control valve VL1.

The orifice OL1 is provided downstream of the control valve VL1 and at a terminus L21 of the second flow channel L2. The orifice OL1 has the same function as that of the orifice included in the pressure type flow rate control apparatus FC1. The switching valve VL2 is provided at the connection point PP1 between the first flow channel L1 and the terminus L21 of the second flow channel L2, and controls a supply timing of the second gas which is supplied from the outlet of the orifice OL1 to the first flow channel L1. The switching valve VL2 has a function of controlling the supply timing of the second gas while allowing passage of the first gas. The details of the configuration of the switching valve VL2 will be described later. The second gas of the second gas source GS2 has its flow rate adjusted by the control valve VL1 and the orifice OL1, is supplied to the first flow channel L1 by the opening operation of the switching valve VL2 at the connection point PP1 with the first flow channel L1, and is supplied to the chamber 12 through the first flow channel L1.

The gas supply system 1 includes an exhaust mechanism E, connected to the flow channel between the control valve VL1 and the orifice OL1 in the second flow channel L2, which exhausts the second gas. The exhaust mechanism E is connected to the second flow channel L2 through an exhaust flow channel EL. The exhaust flow channel EL is connected to a connection point PP2 between the control valve VL1 and the orifice OL1 in the second flow channel L2. The exhaust mechanism E may be connected to the orifice OL1 side in the flow channel between the control valve VL1 and the orifice OL1. That is, the length of a flow channel between the connection point PP2 and the orifice OL1 may be smaller than the length of a flow channel between the control valve VL1 and the connection point PP2. In the flow channel between the control valve VL1 and the orifice OL1, the exhaust mechanism E is connected to the orifice OL1 side, and thus it is possible to further reduce an error of pressure adjustment than in a case where the exhaust mechanism is connected to the control valve VL1 side.

The exhaust mechanism E may include an orifice OL2 and an exhaust valve VL3 (an example of a second exhaust valve). The orifice OL2 has the same function as that of the orifice included in the pressure type flow rate control apparatus FC1. Meanwhile, the exhaust flow channel EL including the orifice OL2 is also referred to as a small exhaust flow channel. The exhaust flow channel EL is connected to an exhaust apparatus 51 that exhausts the chamber 12. Meanwhile, the exhaust flow channel EL may be connected to another exhaust apparatus. The exhaust valve VL3 may be provided in the exhaust flow channel EL, and control an exhaust timing. In a case where the exhaust valve VL3 is set to be opened, a second gas having its flow rate controlled in the orifice OL2 in the second gas existing in the flow channel between control valve VL1 and the orifice OL1 is exhausted from the exhaust flow channel EL.

The gas supply system 1 includes a controller C1 that brings the control valve VL1, the switching valve VL2 and the exhaust mechanism E into operation. The controller C1 is a computer including a processor, a storage unit, an input device, a display device, and the like. The controller C1 inputs a recipe stored in the storage unit, and outputs a signal to the control circuit C2 that brings the control valve VL1 into operation. In addition, the controller C1 inputs the recipe stored in the storage unit, and controls a switching operation of the switching valve VL2. In addition, the controller C1 inputs the recipe stored in the storage unit, and controls the exhaust mechanism E. For example, the controller C1 may operate the exhaust valve VL3 through the control circuit C2.

The orifice OL1 and the switching valve VL2 may be disposed further downstream than an inlet block 55 provided to the chamber 12. For example, the inlet block 55 is disposed on the downstream side of the pressure type flow rate control apparatus FC1 in the first flow channel L1 and the upstream side of the connection point PP1 to the second flow channel L2. Similarly, the inlet block 55 is disposed between the control valve VL1 and the orifice OL1. The inlet block 55 has a flow channel formed therein, and connects piping on the upstream side of the inlet block 55 and piping on the downstream side of the inlet block 55 or the chamber 12. The inlet block 55 is disconnected when the chamber 12 is to the atmosphere, and divides the connected piping or separates the chamber 12 from the piping. Meanwhile, the side (chamber 12 side) located further downstream than the inlet block 55 may be exhausted to the atmosphere or lower. In addition, the inlet block 55 of the first flow channel may be the same member as the inlet block 55 of the second flow channel, and may be a member different therefrom. The orifice OL1 and the switching valve VL2 are located on the side located further downstream than the inlet block 55, that is, the chamber 12 side rather than the inlet block 55, it is possible to perform gas control at a position closer to the chamber 12 as compared to a case of the locations thereof on the side located further upstream than the inlet block 55. Thus, it is possible to improve the responsiveness of gases which are supplied to the chamber 12.

The control valve VL1 and the control circuit C2 which are provided on the second gas source GS2 side on the basis of the inlet block 55 may be unitized (unit U1 in the drawing). The orifice OL1 and the switching valve VL2 which are provided on the chamber 12 side on the basis of the inlet block 55 may be unitized (unit U2 in the drawing). The term "unitization" refers to integral formation as one component. Meanwhile, the unit U2 may include the pressure detector PM and the temperature detector TM. In addition, the unit U2 may include a portion of an exhaust flow channel described later.

Figure 2:
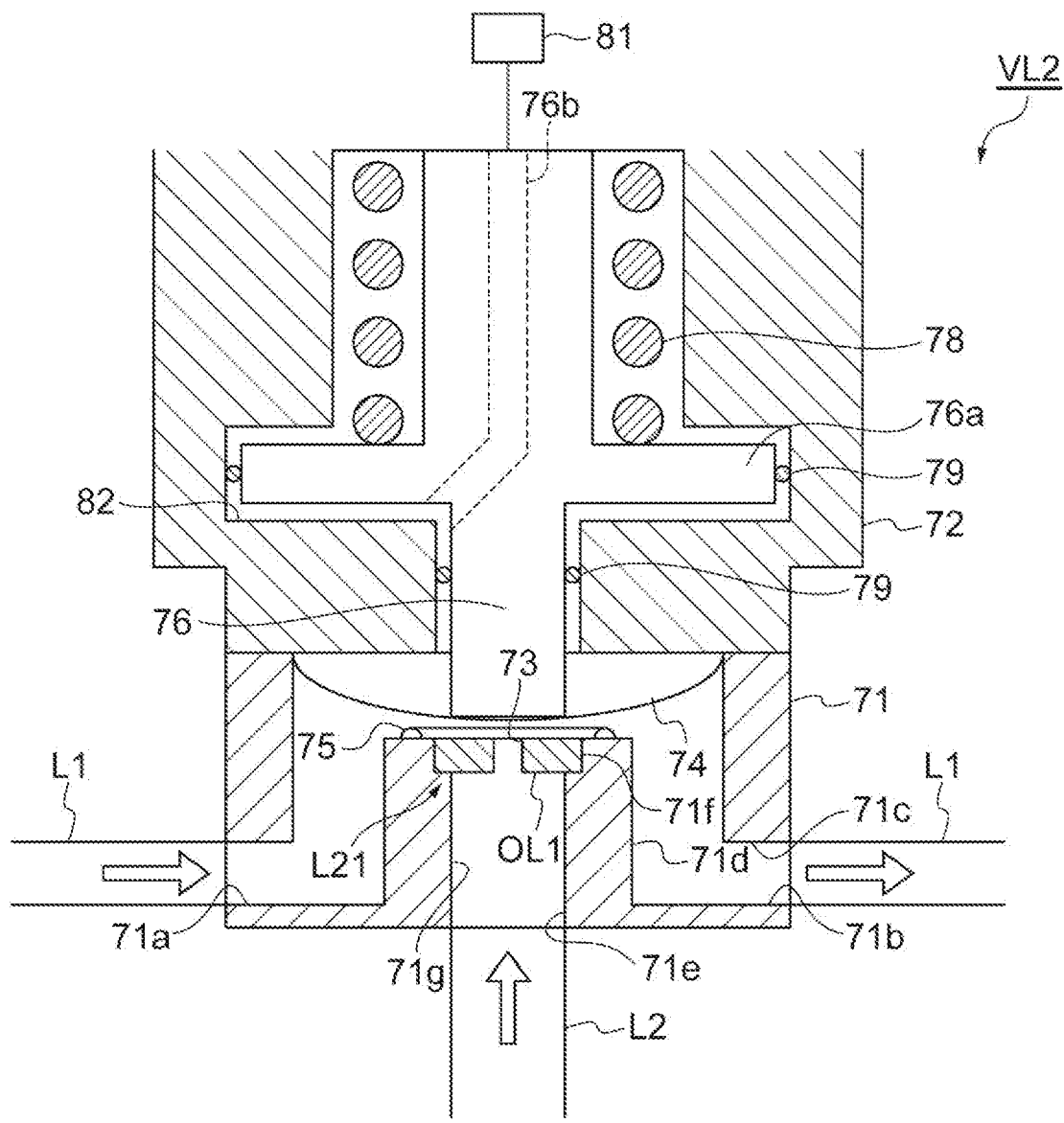
FIG. 2 is a cross-sectional view schematically illustrating a switching valve.

Next, the details of the configuration of the switching valve VL2 will be described. FIG. 2 is a cross-sectional view schematically illustrating the switching valve VL2. The switching valve VL2 is disposed on the first flow channel L1. As shown in FIG. 2, the switching valve VL2 includes a lower main body 71 and an upper main body 72. A sealing member 74 exhibiting a valve function is disposed between the lower main body 71 and the upper main body 72. The lower main body 71 has a flow channel for circulating a gas formed therein. The upper main body 72 includes a component that brings the sealing member 74 into operation. The sealing member 74 may be constituted by a member having flexibility. The sealing member 74 maybe, for example, an elastic member, a diaphragm, a bellows, or the like.

The lower main body 71 has a flow channel serving as a portion of the first flow channel L1 formed therein. As a specific example, the lower main body 71 has an inlet 71a and an outlet 71b, and has an internal flow channel 71c extending from the inlet 71a to the outlet 71b. The lower main body 71 has the terminus L21 of the second flow channel L2 therein. That is, the orifice OL1 provided in the terminus L21 is housed inside the lower main body 71. The first flow channel L1 and the second flow channel L2 merge inside the lower main body 71. The switching valve VL2 switches the terminus L21 of the second flow channel L2 using the sealing member 74, and thus controls a timing at which the second gas merges into the first flow channel.

As a specific example, an orifice support portion 71d for supporting the orifice OL1 is formed within the internal flow channel 71c. The orifice support portion 71d protrudes from the inner wall of the internal flow channel 71c toward the upper main body 72 side (sealing member 74 side) of the internal flow channel 71c. The orifice support portion 71d has an inlet 71e and an outlet 71f, and has an internal flow channel 71g extending from the inlet 71e to the outlet 71f. The internal flow channel 71g constitutes a portion of the second flow channel L2. The orifice OL1 is provided on the outlet 71f of the orifice support portion 71d which is the terminus L21 of the second flow channel L2. A seal portion 75 protruding to the upper main body 72 side (sealing member 74 side) rather than the orifice OL1 is provided in the vicinity of the orifice OL1.

The upper main body 72 includes a component that controls a distance between the sealing member 74 and the orifice OL1. As a specific example, the upper main body 72 includes a cylinder 76, an urging member 78 and a driving portion 81.

The cylinder 76 fixedly supports the sealing member 74, and is housed inside the upper main body 72. For example, the cylinder 76 fixes the sealing member 74 to the lower end thereof. The cylinder 76 includes a protruding portion 76a of which the diameter is expanded toward the outer side. The cylinder 76 includes a flow channel 76b therein. A seal member 79 is provided between the lateral side of the protruding portion 76a and the inner wall of the upper main body 72, and between the lateral side of the cylinder 76 which is located further downward than the protruding portion 76a and the inner wall of the upper main body 72. A space 82 is formed by the inner wall of the upper main body 72, the sidewall of the cylinder 76, the lower surface of the protruding portion 76a, and the seal member 79. The flow channel 76b of the cylinder 76 communicates with the space 82.

The urging member 78 elastically urges the cylinder 76 in a direction in which the sealing member 74 is pressed against the orifice OL1. For example, the cylinder 76 is urged against the lower main body 71 side (orifice OL1 side). More specifically, the urging member 78 gives an urging force to the upper surface of the protruding portion 76a of the cylinder 76 downward. The sealing member 74 is pressed against the orifice OL1 by the urging member 78 so as to seal the outlet 73 of the orifice OL1. In this manner, the second flow channel is set to be closed by the action of the urging member 78 (closing control). The urging member 78 is constituted by, for example, an elastic body. As a specific example, the urging member 78 is a spring.

The driving portion 81 moves the cylinder 76 in a direction opposite to the pressed direction. The driving portion 81 supplies air to the flow channel 76b of the cylinder 76, and fills air into the space 82. In a case where the pressure of the air filled into the space 82 becomes larger than the urging force of the urging member 78, the cylinder 76 rises together with the sealing member 74. That is, the sealing member 74 is separated from the orifice OL1 by the driving portion 81. In this manner, the second flow channel is set to be opened by the driving portion 81 (opening control).

Figure 3:
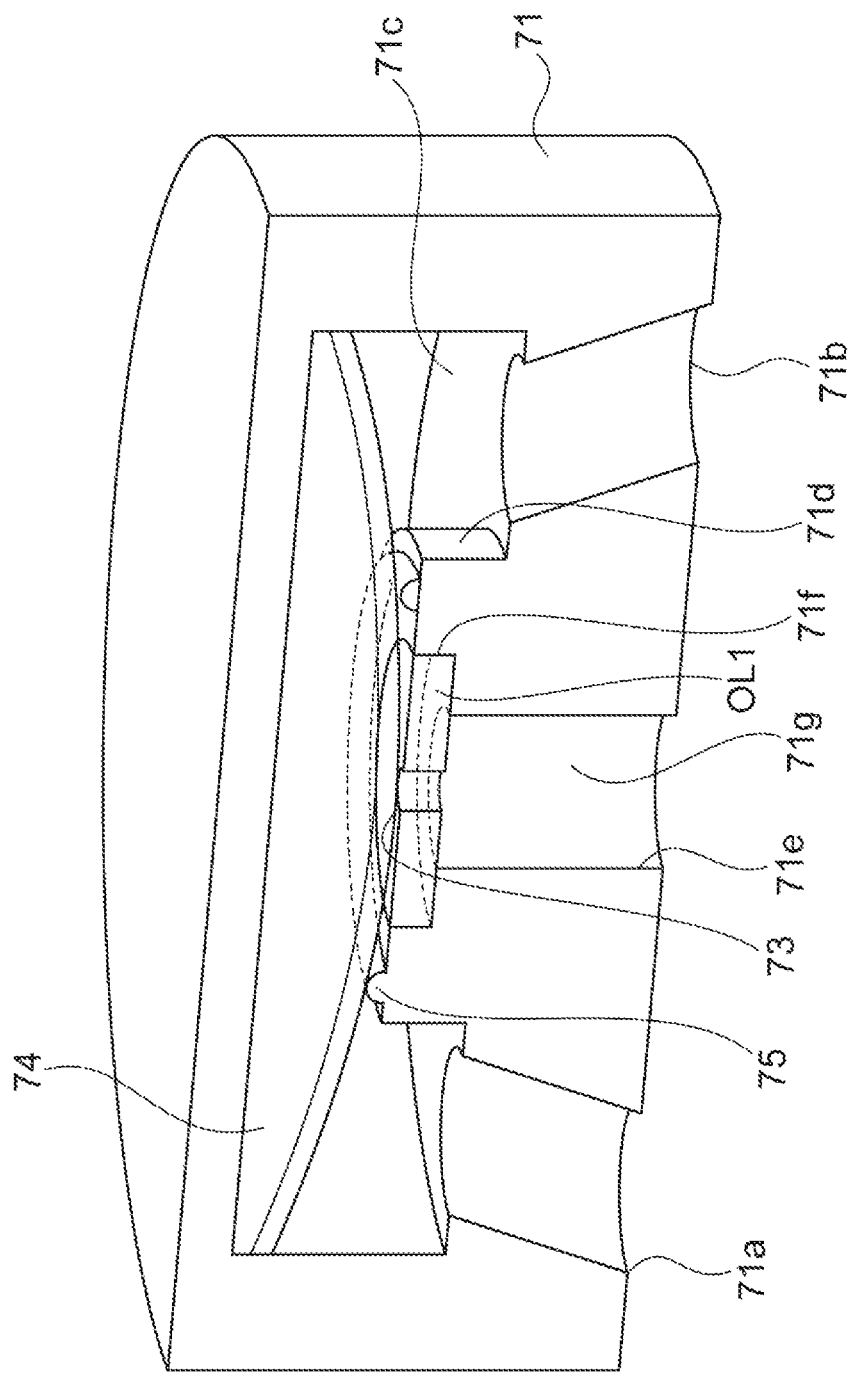
FIG. 3 is a diagram schematically illustrating a lower structure of the switching valve.

The internal flow channel 71c of the lower main body 71 has a structure in which the channel is not blocked by the operation of the sealing member 74. That is, the first flow channel L1 is not blocked by the operation of the sealing member 74, and is set to be in a state of communicating at all times. FIG. 3 is a diagram schematically illustrating a lower structure of the switching valve VL2. As shown in FIG. 3, the internal flow channel 71c is formed so as to surround the periphery of the orifice support portion 71d. The first gas passes through the lateral portion of the orifice support portion 71d when the sealing member 74 is pressed against the orifice OL1, and passes through the lateral portion and upper portion of the orifice support portion 71d when the sealing member 74 is separated from the orifice OL1. In this manner, the sealing member 74 realizes switching of the second flow channel L2 without influencing the circulation of the first flow channel L1.

As stated above, in the gas supply system 1, the orifice OL1 is provided downstream of the control valve VL1 and at the terminus L21 of the second flow channel L2, and the switching valve VL2 is provided at the connection point PP1 between the first flow channel L1 and the terminus L21 of the second flow channel L2. That is, since the orifice OL1 and the switching valve VL2 are disposed at the connection point PP1 between the first flow channel L1 and the terminus L21 of the second flow channel L2, it is possible to minimize a flow channel from the orifice OL1 to the switching valve VL2. Thereby, when the switching valve VL2 is set to be opened, it is possible to prevent a gas remaining in the flow channel from the orifice OL1 to the switching valve VL2 from being supplied to the chamber in a state where the flow rate thereof is not controlled.

In addition, in the gas supply system 1, since the switching valve VL2 is provided at the connection point PP1 between the first flow channel L1 and the terminus L21 of the second flow channel L2, it is possible to minimize a flow channel from the switching valve VL2 to the connection point PP1. Thereby, even in a case where the pressure of a gas flowing through the first flow channel L1 is higher than the pressure of a gas flowing through the second flow channel L2, it is possible to prevent it from taking time for the second gas to be filled into a flow channel between the switching valve VL2 and the connection point PP1.

Further, in the gas supply system 1, since the exhaust mechanism E that exhausts the second gas is connected to the flow channel between the control valve VL1 and the orifice OL1 in the second flow channel L2, for example, the switching valve VL2 is set to be closed, and the exhaust mechanism E is brought into operation, whereby the flow channel between the control valve VL1 and the orifice OL1 can be filled with a gas having a predetermined target pressure in a state where supply to the chamber 12 is stopped. Therefore, it is possible to save a time which will be taken until the switching valve VL2 is set to be opened and then the flow channel between the control valve VL1 and the orifice OL1 is filled with the gas having a predetermined target pressure, which leads to excellent responsiveness.

Figure 4:
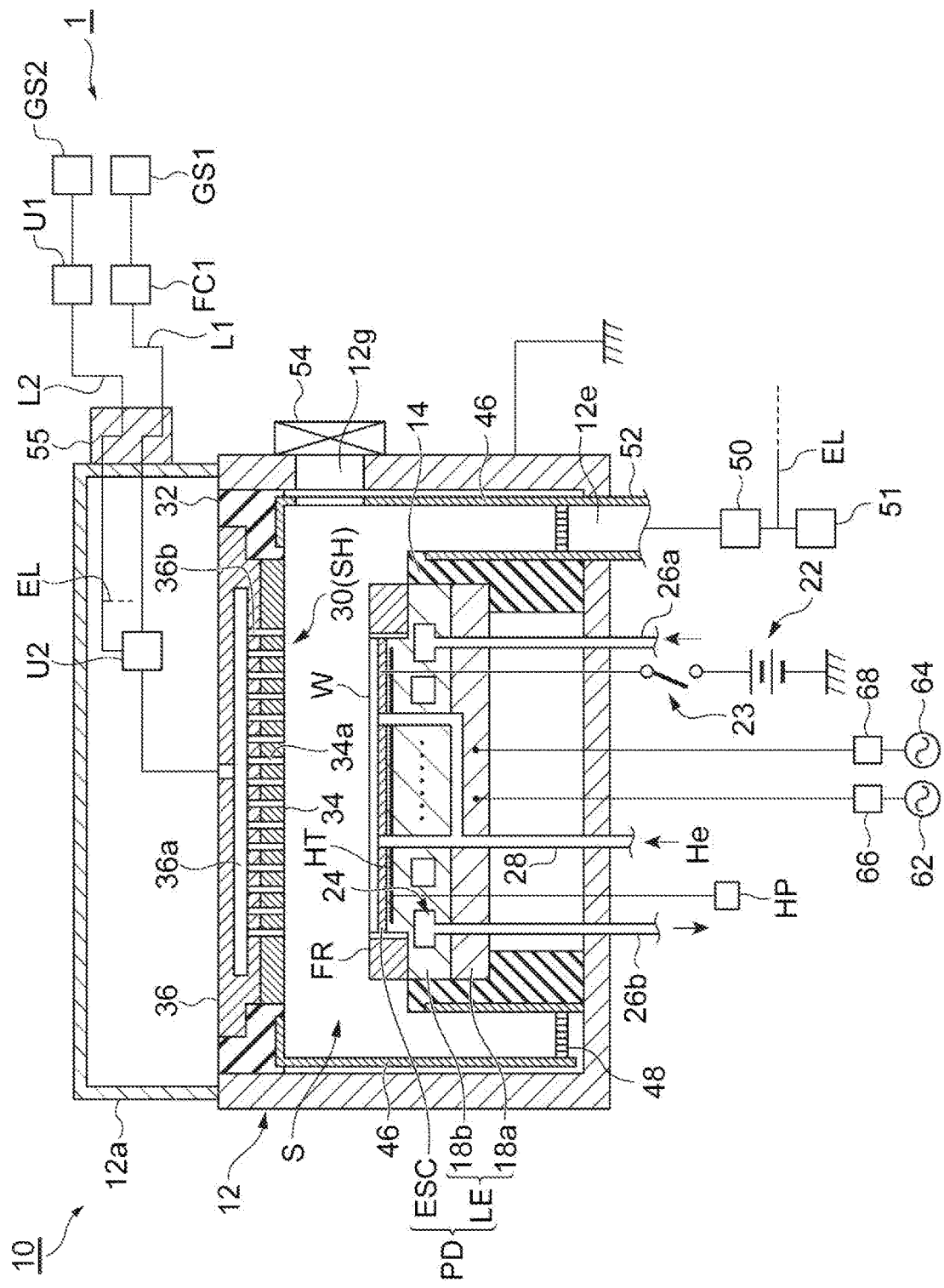
FIG. 4 is a cross-sectional view schematically illustrating a substrate processing system according to an exemplary embodiment.

Hereinafter, as a substrate processing apparatus (substrate processing system) including the gas supply system 1, a plasma processing apparatus of an exemplary embodiment will be described. FIG. 4 is a diagram schematically illustrating a plasma processing apparatus according to an exemplary embodiment. A plasma processing apparatus 10 shown in FIG. 4 is a capacitive coupling type plasma processing apparatus, and is an apparatus which is used for plasma etching, for example, as plasma processing.

The plasma processing apparatus 10 includes the chamber 12. The chamber 12 has a substantially cylindrical shape. The chamber 12 is constituted of, for example, aluminum, and has anodic oxidation performed on the inner wall surface thereof. This chamber 12 is grounded by security. In addition, a grounded conductor 12a is mounted on the upper end of the sidewall of the chamber 12 so as to extend from the sidewall upward. The grounded conductor 12a has a substantially cylindrical shape. In addition, a carrying-in outlet 12g of a substrate (hereinafter, referred to as a "wafer W") is provided on the sidewall of the chamber 12, and this carrying-in outlet 12g is configured to be capable of being switched by a gate valve 54.

A support portion 14 of a substantially cylindrical shape is provided on the bottom of the chamber 12. The support portion 14 is constituted of, for example, an insulating material. The support portion 14 extends from the bottom of the chamber 12 in a vertical direction, within the chamber 12. In addition, a placing table PD is provided within the chamber 12. The placing table PD is supported by the support portion 14.

The placing table PD holds the wafer W on the upper surface thereof. The placing table PD includes a lower electrode LE and an electrostatic chuck ESC. The lower electrode LE includes a first plate 18a and a second plate 18b. The first plate 18a and the second plate 18b are constituted of a metal such as, for example, aluminum, and have a substantially discoid shape. The second plate 18b is provided on the first plate 18a, and is electrically connected to the first plate 18a.

The electrostatic chuck ESC is provided on the second plate 18b. The electrostatic chuck ESC has a structure in which an electrode which is a conductive film is disposed between a pair of insulating layers or insulating sheets. A direct-current power source 22 is electrically connected to the electrode of the electrostatic chuck ESC through a switch 23. This electrostatic chuck ESC adsorbs the wafer W using an electrostatic force such as a Coulomb's force generated by a direct-current voltage from the direct-current power source 22. Thereby, the electrostatic chuck ESC can hold the wafer W.

A focus ring FR is disposed on the peripheral edge of the second plate 18b so as to surround the edge of the wafer W and the electrostatic chuck ESC. The focus ring FR is provided in order to improve the uniformity of plasma processing. The focus ring FR may be constituted of a material such as, for example, silicon, quartz, or SiC.

A refrigerant flow channel 24 is provided within the second plate 18b. The refrigerant flow channel 24 constitutes a temperature-adjusting mechanism. A refrigerant is supplied to the refrigerant flow channel 24 from a chiller unit provided outside the chamber 12 through piping 26a. The refrigerant supplied to the refrigerant flow channel 24 is returned to the chiller unit through the piping 26b. In this manner, the refrigerant is supplied to the refrigerant flow channel 24 so as to be circulated. The temperature of this refrigerant is controlled, and thus the temperature of the wafer W supported by the electrostatic chuck ESC is controlled.

In addition, the plasma processing apparatus 10 is provided with a gas supply line 28. The gas supply line 28 supplies a heat-transfer gas from a heat-transfer gas supply mechanism, for example, a He gas between the upper surface of the electrostatic chuck ESC and the rear surface of the wafer W.

In addition, the plasma processing apparatus 10 is provided with a heater HT which is a heating element. The heater HT is buried within, for example, the second plate 18b. A heater power source HP is connected to the heater HT. By supplying power supplied from the heater power source HP to the heater HT, the temperature of the placing table PD is adjusted, and the temperature of the wafer W placed on the placing table PD is adjusted. Meanwhile, the heater HT may be built into the electrostatic chuck ESC.

In addition, the plasma processing apparatus 10 includes an upper electrode 30. The upper electrode 30 is disposed so as to be opposite to the placing table PD, on the upper portion of the placing table PD. The lower electrode LE and the upper electrode 30 are provided substantially in parallel to each other. A processing space S for performing plasma processing on the wafer W is provided between the upper electrode 30 and the placing table PD.

The upper electrode 30 is supported on the upper portion of the chamber 12 with an insulating shielding member 32 interposed therebetween. In an exemplary embodiment, the upper electrode 30 may be configured such that a distance in a vertical direction from the upper surface of the placing table PD, that is, a wafer placement surface is variable. The upper electrode 30 may include a top plate 34 and a support 36. The top plate 34 faces the processing space S, and the top plate 34 is provided with a plurality of gas discharge holes 34a. This top plate 34 may be constituted of silicon or a silicon oxide. Alternatively, the top plate 34 may be formed by coating a conductive (for example, aluminum) base material with ceramics.

The support 36 detachably supports the top plate 34, and may be constituted of a conductive material such as, for example, aluminum. This support 36 may have a water-cooling structure. A gas diffusion chamber 36a is provided within the support 36. The merging pipe (first flow channel L1) of the gas supply system 1 is connected to the gas diffusion chamber 36a.

A plurality of continuous holes 36b for connecting the gas diffusion chamber 36a and the plurality of gas discharge holes 34a extending downward of the gas diffusion chamber 36a are formed in the support 36. The upper electrode 30 having such a configuration constitutes a shower head SH.

In addition, in the plasma processing apparatus 10, a deposit shield 46 is detachably provided along the inner wall of the chamber 12. The deposit shield 46 is also provided on the outer circumference of the support portion 14. The deposit shield 46 is used for preventing by-products (deposits) of plasma processing from being attached to the chamber 12, and may be formed by covering an aluminum material with ceramics such as $Y_2O_3$.

An exhaust plate 48 is provided on the bottom side of the chamber 12, and between the support portion 14 and the sidewall of the chamber 12. The exhaust plate 48 may be formed by covering, for example, an aluminum material with ceramics such as $Y_2O_3$. A large number of through-holes are formed in the exhaust plate 48. The lower portion of this exhaust plate 48 and the chamber 12 are provided with an exhaust port 12e. An exhaust apparatus 50 and an exhaust apparatus 51 are connected to the exhaust port 12e through an exhaust pipe 52. In an exemplary embodiment, the exhaust apparatus 50 is a turbo-molecular pump, and the exhaust apparatus 51 is a dry pump. The exhaust apparatus 50 is provided further upstream than the exhaust apparatus 51 with respect to the chamber 12. The exhaust flow channel EL of the gas supply system 1 is connected to piping between the exhaust apparatus 50 and the exhaust apparatus 51. The exhaust flow channel EL is connected between the exhaust apparatus 50 and the exhaust apparatus 51, and thus the backflow of a gas from the exhaust flow channel EL into the chamber 12 is suppressed.

In addition, the plasma processing apparatus 10 further includes a first high-frequency power source 62 and a second high-frequency power source 64. The first high-frequency power source 62 is a power source that generates a first high frequency for plasma generation, and generates a frequency of 27 to 100 MHz or a high frequency of 40 MHz in an example. The first high-frequency power source 62 is connected to the lower electrode LE with a matching device 66 interposed therebetween. The matching device 66 includes a circuit for matching output impedance of the first high-frequency power source 62 with input impedance on the load side (lower electrode LE side).

The second high-frequency power source 64 is a power source that generates a second high frequency for attracting ions to the wafer W, that is, a high frequency for a bias, and generates a frequency in a range of 400 kHz to 13.56 MHz, or a second high frequency of 3.2 MHz in an example. The second high-frequency power source 64 is connected to the lower electrode LE with a matching device 68 interposed therebetween. The matching device 68 includes a circuit for matching output impedance of the second high-frequency power source 64 with input impedance on the load side (lower electrode LE side).

In addition, in an exemplary embodiment, the controller C1 shown in FIG. 1 controls each portion of the plasma processing apparatus 10 in order to perform plasma processing executed by the plasma processing apparatus 10.

In this plasma processing apparatus 10, it is possible to generate plasma by exciting a gas supplied into the chamber 12. The wafer W can be processed by active species. In addition, while the first gas is supplied by the gas supply system 1, for example, at a first flow rate, the second gas can be supplied into the chamber 12 intermittently with good responsiveness at a second flow rate smaller than the first flow rate. Therefore, it is possible to enhance the throughput of a process of alternately performing different plasma processings on the wafer W.

Next, a gas supply method performed by the gas supply system 1 will be described. The gas supply method may be realized by a component being operated by the controller C1. FIGS. 5A and 5B are diagrams illustrating switching timings of the secondary valve for the first gas and the switching valve VL2 for the second gas. As shown in FIGS. 5A and 5B, the controller C1 sets the secondary valve for the first gas to be opened. Next, the controller C1 causes the switching valve VL2 to repeat switching in a state where the secondary valve for the first gas is set to be opened. As an example of such a process, the first gas is a carrier gas, and the second gas is a processing gas required for plasma processing.

The gas supply system 1 controls switching of the control valve VL1 and the exhaust valve VL3 in accordance with switching control of the switching valve VL2. Specifically, in a case where the second gas of a target flow rate is supplied to the first flow channel L1 at a target supply timing, in a predetermined period until arrival at the target supply timing, the controller C1 controls the control valve VL1 to thereby circulate the second gas of the target flow rate in a state where the exhaust mechanism E is brought into operation while the switching valve VL2 is set to be closed, and sets the switching valve to be opened at the time of arrival at the target supply timing.

Figure 6:
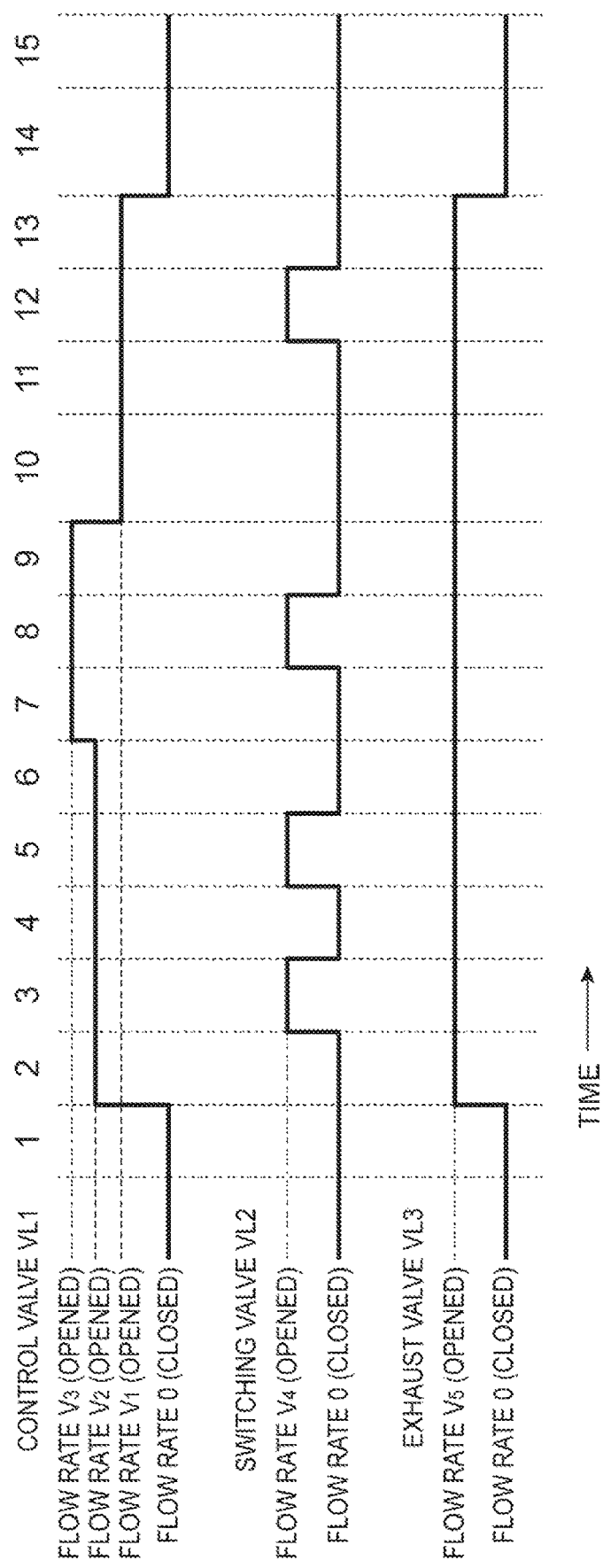
FIG. 6 is a diagram illustrating flow rates of the second gas passing through a control valve, a switching valve and an exhaust valve for the second gas.

FIG. 6 is a diagram illustrating flow rates of the second gas passing through the control valve VL1, the switching valve VL2 and the exhaust valve VL3 for the second gas. In FIG. 6, steps of a processing process are represented using broken lines, and a case is shown in which the number of steps of the entire processing process is a total of 15. The switching valve VL2 performs the switching operation described with reference to FIGS. 5A and 5B, and thus the second gas intermittently circulates through the switching valve VL2 as shown in FIG. 6. In FIG. 6, the controller C1 sets the switching valve VL2 to be opened in steps 3, 5, 8 and 12 (an example of the target supply timing). In step 2 (an example of a predetermined period until arrival at the target supply timing) which is a step immediately before step 3, the controller C1 sets the control valve VL1 and the exhaust valve VL3 to be opened in a state where the switching valve VL2 is set to be closed, and brings the exhaust mechanism E into operation (preparation step). That is, in step 2, the second gas having passed through the control valve VL1 is not supplied to the first flow channel L1, and is exhausted through the exhaust flow channel EL. In this case, the pressure and flow rate of a gas within the second flow channel is controlled to a set target value by the control valve VL1. The controller C1 can synchronize the control valve VL1 with the exhaust valve VL3 using any method. For example, in a case where the flow rate of an input to the control valve VL1 is larger than 0, the controller C1 may control the exhaust valve VL3 of an exhaust flow channel so as to be set to be opened. In a case where the flow rate of an input to the control valve VL1 is 0, the controller C1 may set the exhaust valve VL3 of the exhaust flow channel to be closed.

The controller C1 sets the switching valve VL2 to be opened at the time of step 3 which is the target supply timing during the continuation of the preparation step, and supplies the second gas of the target flow rate to the first flow channel (supply step). In this manner, the switching valve VL2 is set to be closed, and the exhaust mechanism E is brought into operation, whereby the flow channel between the control valve VL1 and the orifice OL1 can be filled with a gas having a predetermined target pressure in a state where supply to the chamber 12 is stopped. Therefore, it is possible to save a time which will be taken until the switching valve VL2 is set to be opened and then the flow channel between the control valve VL1 and the orifice OL1 is filled with the gas having a predetermined target pressure, which leads to excellent responsiveness.

Second Exemplary Embodiment

A gas supply system 1A according to a second exemplary embodiment is different from the gas supply system 1 according to the first exemplary embodiment, in an exhaust mechanism EA alternative to the exhaust mechanism E, and a gas supply method performed by the controller C1. In the second exemplary embodiment, a description will be given with a focus on differences from the first exemplary embodiment, and a repeated description will not be given.

Figure 7:
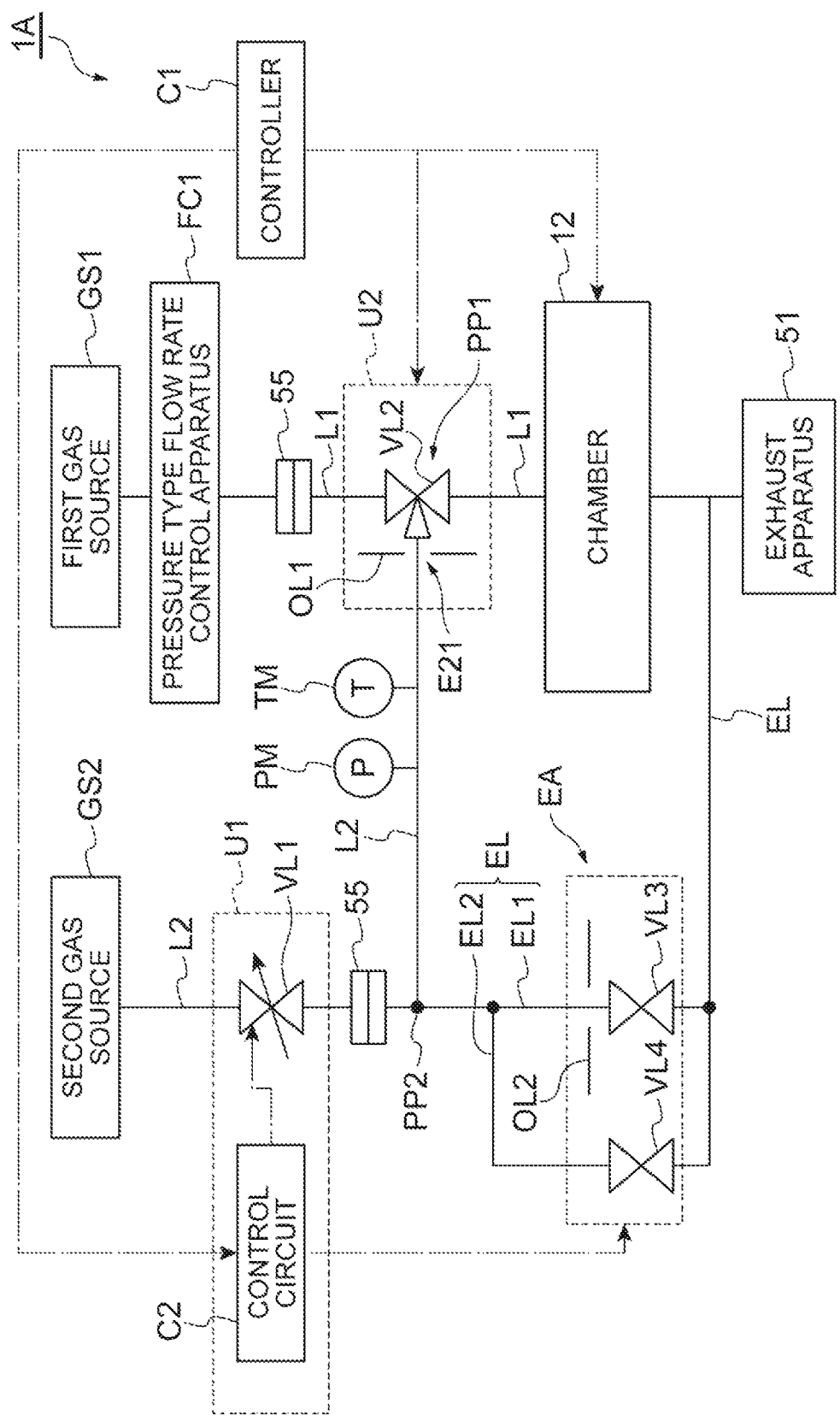
FIG. 7 is a schematic diagram of a gas supply system according to an exemplary embodiment.

FIG. 7 is a schematic diagram of the gas supply system 1A according to the second exemplary embodiment. The exhaust mechanism EA includes the small exhaust flow channel EL1 and a large exhaust flow channel EL2 as the exhaust flow channel EL. The small exhaust flow channel EL1 and the large exhaust flow channel EL2 are connected to the flow channel between the control valve VL1 and the orifice OL1 in the second flow channel. The small exhaust flow channel EL1 has a smaller amount of exhaust than the large exhaust flow channel EL2. Specifically, the small exhaust flow channel EL1 is provided with the orifice OL2, and the amount of exhaust is controlled to a first amount of exhaust. The small exhaust flow channel EL1 may be provided with the exhaust valve VL3 (an example of the second exhaust valve) that controls an exhaust timing. The large exhaust flow channel EL2 exhausts at a second amount of exhaust larger than the first amount of exhaust. The large exhaust flow channel EL2 is not provided with a device that controls a flow rate. The large exhaust flow channel EL2 may be provided with an exhaust valve VL4 (an example of the first exhaust valve) that controls an exhaust timing. Similarly to the exhaust mechanism E according to the first exemplary embodiment, the exhaust mechanism EA may be controlled by the controller C1 through the control circuit C2. Other configurations of the gas supply system 1A are the same as those of the gas supply system 1. The gas supply system 1A can be applied to the plasma processing apparatus 10.

Next, a gas supply method performed by the gas supply system 1A will be described. The gas supply method may be realized by a component being operated by the controller C1. Switching timings of the secondary valve for the first gas and the switching valve VL2 for the second gas are the same as those in FIGS. 5A and 5B. The gas supply system 1A controls switching of the control valve VL1 and the exhaust valves VL3 and VL4 in accordance with switching control of the switching valve VL2. Specifically, in a case where the second gas of the target flow rate is supplied to the first flow channel L1 at a target supply timing, in a predetermined period until arrival at the target supply timing, the controller C1 controls the control valve VL1 to thereby circulate the second gas of the target flow rate in a state where the exhaust mechanism EA is brought into operation while the switching valve VL2 is set to be closed, and sets the switching valve to be opened at the time of arrival at the target supply timing.

FIG. 8 is a diagram illustrating flow rates of the second gas passing through the control valve VL1, the switching valve VL2 and the exhaust valves VL3 and VL4 for the second gas. Meanwhile, only flow rates relating to the control valve VL1, or an input flow rate (IN) and an output flow rate (OUT) to the control valve VL1 are shown. In FIG. 8, steps of a processing process are represented using broken lines, and a case is shown in which the number of steps of the entire processing process is a total of 15. The switching valve VL2 performs the switching operation described with reference to FIGS. 5A and 5B, and thus the second gas intermittently circulates through the switching valve VL2 as shown in FIG. 8. In FIG. 8, the controller C1 sets the switching valve VL2 to be opened in steps 3, 5, 8 and 12 (an example of the target supply timing). The controller C1 performs the preparation step and the supply step described in the gas supply method of the first exemplary embodiment.

Here, the controller C1 controls the exhaust mechanism EA as follows. In a case where the flow rate of an input to the control valve VL1 is larger than 0, the controller C1 sets the exhaust valve VL3 of the small exhaust flow channel EL1 to be opened. In a case where the flow rate of an input to the control valve VL1 is 0, the controller C1 sets the exhaust valve VL3 of the small exhaust flow channel EL1 to be closed. The controller C1 performs switching control on the exhaust valve VL4 of the large exhaust flow channel EL2, using a relationship between the input flow rate and the output flow rate to the control valve VL1. As a specific example, the controller C1 sets the exhaust valve VL4 of the large exhaust flow channel EL2 to be opened in a case where the input flow rate is set to be equal to or less than a predetermined amount with respect to the output flow rate, and sets the exhaust valve to be closed in other cases. In FIG. 8, in step 2 and step 7, the input flow rate is not set to be equal to or less than the predetermined amount with respect to the output flow rate, and in step 10 and step 14, a case is shown in which the input flow rate is set to be equal to or less than the predetermined amount with respect to the output flow rate. As shown in FIG. 8, the controller C1 sets the exhaust valve VL4 of the large exhaust flow channel EL2 to be opened in step 10 and step 14, and increases the amount of exhaust. In this manner, since the exhaust timing can be controlled for each exhaust flow channel, it is possible to finely adjust pressure in the flow channel between the control valve VL1 and the orifice OL1.

Third Exemplary Embodiment

A gas supply system 1B according to a third exemplary embodiment is different from the gas supply system 1 according to the first exemplary embodiment, in a further configuration in which a third gas is merged into the first flow channel L1, and a gas supply method performed by the controller C1. In the third exemplary embodiment, a description will be given with a focus on differences from the first exemplary embodiment, and a repeated description will not be given.

FIG. 9 is a schematic diagram of the gas supply system 1B according to the third exemplary embodiment. The gas supply system 1B includes a third flow channel L3 that connects a third gas source GS3 of the third gas and the first flow channel L1.

A control valve VL41, an orifice OL3, and a switching valve VL5 are disposed in this order on the downstream side of the third gas source GS3 in the third flow channel L3. The control valve VL41 has the same configuration as that of the control valve VL1, and is controlled by a control circuit (not shown) having the same configuration as that of the control circuit C2. The orifice OL3 has the same configuration as that of the orifice OL1. The switching valve VL5 is provided at a connection point PP3 between the first flow channel L1 and the third flow channel L3, and has the same configuration as that of the switching valve VL2. The third gas of the third gas source GS3 has the flow rate thereof adjusted by the control valve VL41 and the orifice OL3, is supplied to the first flow channel L1 by the opening operation of the switching valve VL5 at the connection point PP3 to the first flow channel L1, and is supplied to the chamber 12 through the first flow channel L1.

The gas supply system 1B includes an exhaust mechanism EB, connected to a flow channel between the control valve VL41 and the orifice OL3 in the third flow channel L3, which exhausts the third gas. The exhaust mechanism EB is connected to the third flow channel L3 through the exhaust flow channel EL3. The exhaust flow channel EL3 is connected to a connection point PP4 between the control valve VL41 and the orifice OL3 in the third flow channel L3. The exhaust mechanism EB has the same configuration as that of the exhaust mechanism E. The exhaust flow channel EL3 is connected to a connection point PP5 to the exhaust flow channel EL. Meanwhile, the exhaust flow channel EL3 may be connected to another exhaust apparatus.

The above-described component that merges the third gas into the first flow channel L1 may be controlled by the controller C1 described in the first exemplary embodiment. The orifice OL3 and the switching valve VL5 may be disposed further downstream than an inlet block 55 provided to the chamber 12. The orifice OL3 and the switching valve VL5 which are provided on the chamber 12 side on the basis of the inlet block 55 may be unitized (unit U3 in the drawing). Meanwhile, the unit U3 may include a pressure detector PM and a temperature detector TM. In addition, the unit U3 may include a portion of the exhaust flow channel EL3. Other configurations of the gas supply system 1B are the same as those of the gas supply system 1. The gas supply system 1B can be applied to the plasma processing apparatus 10.

Next, a gas supply method performed by the gas supply system 1B will be described. The gas supply method may be realized by a component being operated by the controller C1. The switching timing of the secondary valve for the first gas is arbitrary. That is, the first gas may or may not be introduced. FIGS. 10A and 10B are diagrams illustrating an example of switching timings of the switching valves VL2 and VL5. As shown in FIGS. 10A and 10B, the controller C1 alternately switches the switching valve VL2 for the second gas and the switching valve VL5 for the third gas. That is, the controller C1 periodically switches the switching valves VL2 and VL5, and shifts the period of switching. As an example of such a process, the first gas is a carrier gas, and the second gas and the third gas are processing gases required for plasma processing. In another example, the first gas is not introduced, and the second gas and the third gas are processing gases required for plasma processing. FIGS.

11A and 11B are diagrams illustrating another example of switching timings of the switching valves VL2 and VL5. As shown in FIGS. 11A and 11B, the controller C1 may switch the switching valve VL2 for the second gas and the switching valve VL5 for the third gas by synchronizing the switching valves.

Next, a specific example in which the controller C1 reads and executes a recipe of a processing process will be described. The recipe is previously stored in a storage unit of the controller C1. FIGS. 12A and 12B are diagrams illustrating a recipe and an input to a control circuit corresponding to the recipe. As shown in FIG. 12A, the flow rates of an Ar gas (an example of the first gas), an $O_2$ gas (an example of the second gas) and a $C_4F_6$ gas (an example of the third gas) in the processing process of step 1 to step 8 are previously set in the recipe. In such a recipe, the Ar gas is supplied as a carrier gas in step 1 to step 8, the $O_2$ gas and the $C_4F_6$ gas are supplied as additive gases in step 3 and step 5, and the $C_4F_6$ gas is supplied as an additive gas in step 8. In a case where the recipe shown in FIG. 12A is read from the storage unit, the controller C1 outputs signals to a control circuit of the pressure type flow rate control apparatus FC1 and a control circuit of the control valve VL1 so that processing process shown in FIG. 12B is executed.

In a step immediately before a supply step of an additive gas, a control process shown in FIG. 12B is changed so as to supply an additive gas of the same flow rate as that in the supply step, on the basis of the recipe (hatched portions in the drawing). Specifically, the controller C1 changes the flow rate of the $O_2$ gas in the second step from 0 [sccm] to 6 [sccm], and changes the flow rate of the $C_4F_6$ gas in the second step from 0 [sccm] to 7.5 [sccm]. In addition, the controller C1 changes the flow rate of the $O_2$ gas in the fourth step from 0 [sccm] to 6 [sccm], and changes the flow rate of $C_4F_6$ gas in the fourth step from 0 [sccm] to 7.5 [sccm]. Further, the controller C1 changes the flow rate of the $C_4F_6$ gas in the seventh step from 0 [sccm] to 5.5 [sccm].

The controller C1 and the control circuit control each valve on the basis of an input to the control circuit corresponding to the recipe shown in FIG. 12B. Since a method of controlling valves for the second gas and the third gas is common, a method of controlling the second gas will be described below, and a method of controlling the third gas will be omitted. In addition, in the method of controlling the second gas, only representative steps will be described. FIGS. 13A and 13B are diagrams illustrating an example of switching control of valves for an input. FIG. 13A shows a process of the controller C1. As shown in FIG. 13A, the controller C1 inputs a recipe in which the second gas is supplied at a flow rate α [sccm] in step N. The controller C1 performs a change in a case where the second gas is supplied at the flow rate α [sccm] in step N–1, as an input (target setting) to the control circuit corresponding to the recipe. The controller C1 determines the switching state of a valve in each step. Meanwhile, the controller C1 directly controls the switching valve VL2, and indirectly controls the control valve VL1 and the exhaust valve VL3 through the control circuit of the control valve VL1.

In step N–2, the controller C1 sets the control valve VL1 to be closed, sets the switching valve VL2 to be closed, and sets the exhaust valve VL3 to be closed. In step N–1, the controller C1 sets the control valve VL1 to be opened, sets the switching valve VL2 to be closed, and sets the exhaust valve VL3 to be opened. In step N, the controller C1 sets the control valve VL1 to be opened, sets the switching valve VL2 to be opened, and sets the exhaust valve VL3 to be opened. In step N+1, the controller C1 sets the control valve VL1 to be closed, sets the switching valve VL2 to be closed, and sets the exhaust valve VL3 to be closed.

In each step, the controller C1 switches the switching valve VL2 so as to operate as set, and outputs a signal to the control circuit. The signal output to the control circuit includes a target set flow rate (input) and the switching states of the control valve VL1 and the exhaust valve VL3. The control circuit controls switching of the control valve VL1 and the exhaust valve VL3 in accordance with the signal which is input from the controller C1.

FIG. 13B shows a process of the control circuit to which a signal is input. As shown in FIG. 13B, in step N–2, the control circuit sets the control valve VL1 and the exhaust valve VL3 to be closed. The controller C1 sets the switching valve VL2 to be closed. In step N–1, the control circuit sets the control valve VL1 and the exhaust valve VL3 to be opened. In addition, the control circuit controls the control valve VL1 so that the output flow rate is set to the flow rate α [sccm] (self-control). In addition, the exhaust valve VL3 is set to be opened, and thus the exhaust flow rate is automatically controlled by the orifice (self-control). The controller C1 sets the switching valve VL2 to be closed. In this manner, in step N–1, the second gas circulates at the flow rate α [sccm] in the flow channel between the control valve VL1 and the orifice OL1.

Subsequently, in step N, the control circuit sets the control valve VL1 and the exhaust valve VL3 to be opened. In addition, the control circuit controls the control valve VL1 so that the output flow rate is set to the flow rate α [sccm] (self-control). In addition, the exhaust valve VL3 is set to be opened, and thus the exhaust flow rate is automatically controlled by the orifice (self-control). The controller C1 sets the switching valve VL2 to be opened. In this manner, in step N, the second gas adjusted at the flow rate α [sccm] in step N–1 is supplied to the first flow channel L1. In step N+1, the control circuit sets the control valve VL1 and the exhaust valve VL3 to be closed. The controller C1 sets switching valve VL2 to be closed. Thereby, the supply of the second gas to the first flow channel L1 is stopped. In this manner, the controller C1 performs the preparation step and the supply step described in the gas supply method of the first exemplary embodiment.

FIGS. 14A and 14B are diagrams illustrating another example of switching control of valves for an input. FIG. 14A shows a process of the controller C1. As shown in FIG. 14A, the controller C1 inputs a recipe in which the second gas is supplied at the flow rate α [sccm] in step N, and the second gas is supplied at a flow rate β in step N+1. The controller C1 performs a change in a case where the second gas is supplied at the flow rate α [sccm] in step N–1, as an input (target setting) to the control circuit corresponding to the recipe. Meanwhile, since a step immediately before step N+1 which is a supply step is step N which is a supply step, the flow rate which is set in step N is not changed. That is, in a case where the supply step continues, the preparation step is set in only an initial supply step, and the following process is controlled without the preparation step. Other processes have the same contents as those described in FIGS. 13A and 13B, and a process is executed as shown in FIG. 14B in accordance with the setting contents shown in FIG. 14A.

FIGS. 15A and 15B are diagrams illustrating another example of switching control of valves for an input. FIG. 15A shows a process of the controller C1. As shown in FIG. 15A, the controller C1 inputs a recipe in which the second gas is supplied at the flow rate α [sccm] in step N, and the second gas is supplied at the flow rate β in step N+2. The controller C1 performs a change in a case where the second gas is supplied at the flow rate α [sccm] in step N−1, and the second gas is supplied at the flow rate β in step N+1, as an input (target setting) to the control circuit corresponding to the recipe. Other processes have the same contents as those described in FIGS. 13A and 13B, and a process is executed as shown in FIG. 15B in accordance with the setting contents shown in FIG. 15A.

As stated above, the gas supply system 1B can merge a plurality of gases into the first flow channel L1. In addition, the gas supply system 1B performs the preparation step and the supply step described in the gas supply method of the first exemplary embodiment in each of the second flow channel L2 and the third flow channel L3, and thus can perform gas supply excellent in responsiveness.

Fourth Exemplary Embodiment

A gas supply system 1C according to a fourth exemplary embodiment is different from the gas supply system 1 according to the first exemplary embodiment, in that the orifice OL1 and the switching valve VL2 are located further upstream than the inlet block 55. In the fourth exemplary embodiment, a description will be given with a focus on differences from the first exemplary embodiment, and a repeated description will not be given.

Figure 16:
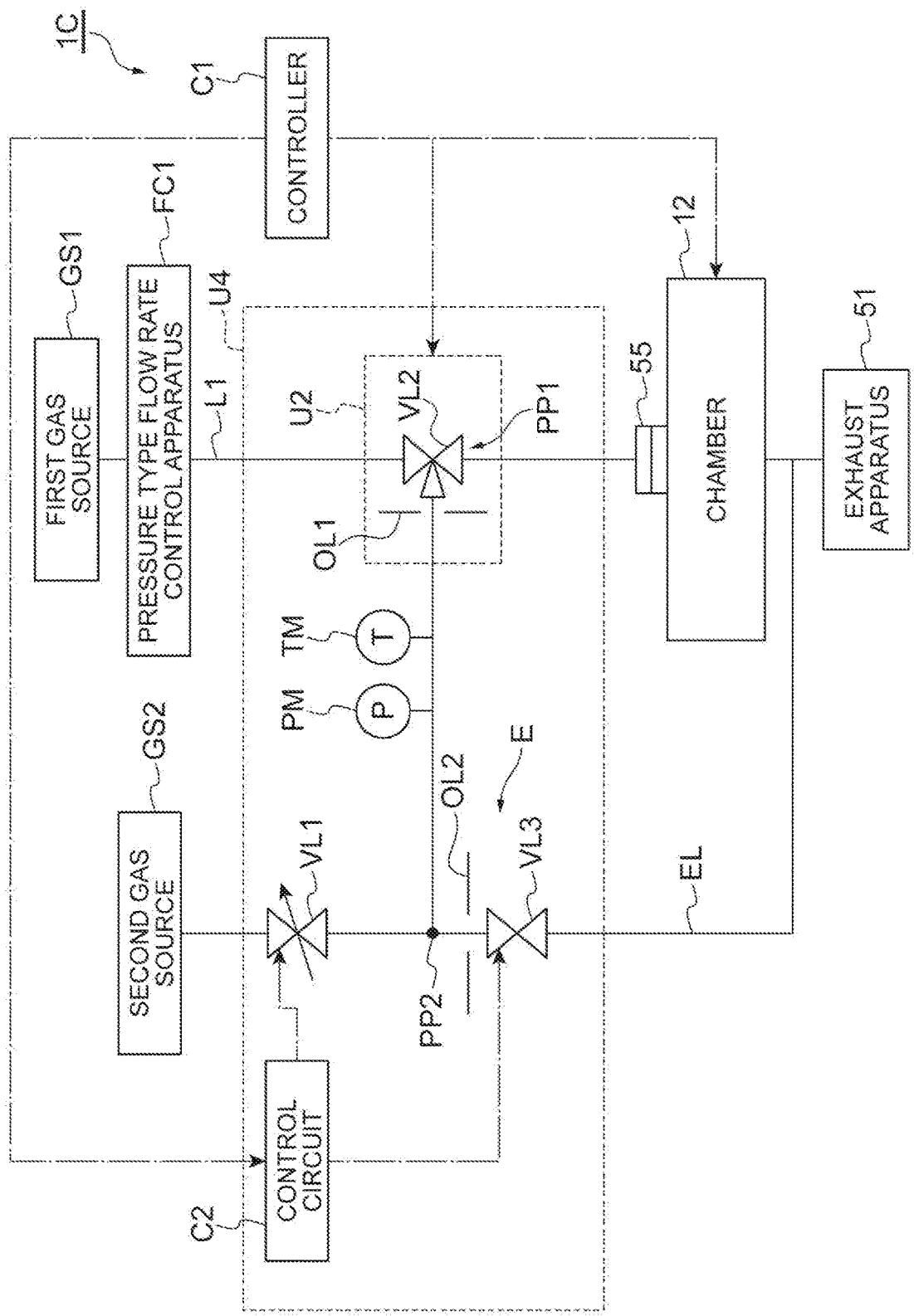
FIG. 16 is a schematic diagram of a gas supply system according to an exemplary embodiment.

FIG. 16 is a schematic diagram of the gas supply system 1C according to the fourth exemplary embodiment. As shown in FIG. 16, in the gas supply system 1C, the connection point PP1 between the first flow channel L1 and the second flow channel L2 is located further upstream than the inlet block 55. Other configurations of the gas supply system 1C are the same as those of the gas supply system 1.

The control valve VL1, the control circuit C2, the orifice OL1 and the switching valve VL2 which are provided on the second gas source GS2 side on the basis of the inlet block 55 may be unitized (unit U4 in the drawing). Meanwhile, the unit U4 may include a pressure detector PM and a temperature detector TM. In addition, the unit U4 may include a portion of the exhaust flow channel EL. As stated above, since the gas supply system 1C can unitize components located from the control valve VL1 to the switching valve VL2, it is easy to handle the respective components.

As stated above, various embodiments have been described, but various modifications can be made without being limited to the above-described embodiments. For example, the respective embodiments may be combined. In addition, the above-described substrate processing apparatus is a capacitive coupling type plasma processing apparatus, but the substrate processing apparatus may be an inductively coupled plasma processing apparatus, or any plasma processing apparatus such as a plasma processing apparatus using surface waves of micro waves.

In addition, in the gas supply systems 1A and 1B, a unit constituted by an orifice and a switching valve may be located further upstream than the inlet block 55.

In addition, the above-described control valve VL1 operates on the basis of the detection results of the pressure detector PM disposed on the upstream side of the switching valve VL2, but there is no limitation thereto. For example, the detection results of a pressure detector which is further added may be used. An additional pressure detector is disposed on, for example, the downstream side of the switching valve VL2, and detects the pressure of the first flow channel L1. The control circuit C2 controls the control valve VL1 so as to reduce a difference between the set flow rate and a calculated flow rate obtained from the measured pressure value of the pressure detector PM, under conditions in which the pressure of the second flow channel L2 is more than twice the pressure of the first flow channel L1. In addition, the control circuit C2 controls the control valve VL1 so as to reduce a difference between the set flow rate and a calculated flow rate obtained from a differential pressure between the measured pressure value of the pressure detector PM and the measured pressure value of the additional pressure detector, under conditions in which the pressure of the second flow channel L2 is less than twice the pressure of the first flow channel L1. In this manner, the above-described control valve VL1 may operate by differential pressure control. In addition, the additional pressure detector may be incorporated into the unit U2 of FIG. 1. That is, the additional pressure detector may be unitized together with the orifice OL1 and the switching valve VL2. Alternatively, the additional pressure detector may be incorporated into the unit U4 of FIG. 16. That is, the additional pressure detector may be unitized together with the control valve VL1, the control circuit C2, the orifice OL1 and the switching valve VL2.

Figure 17:
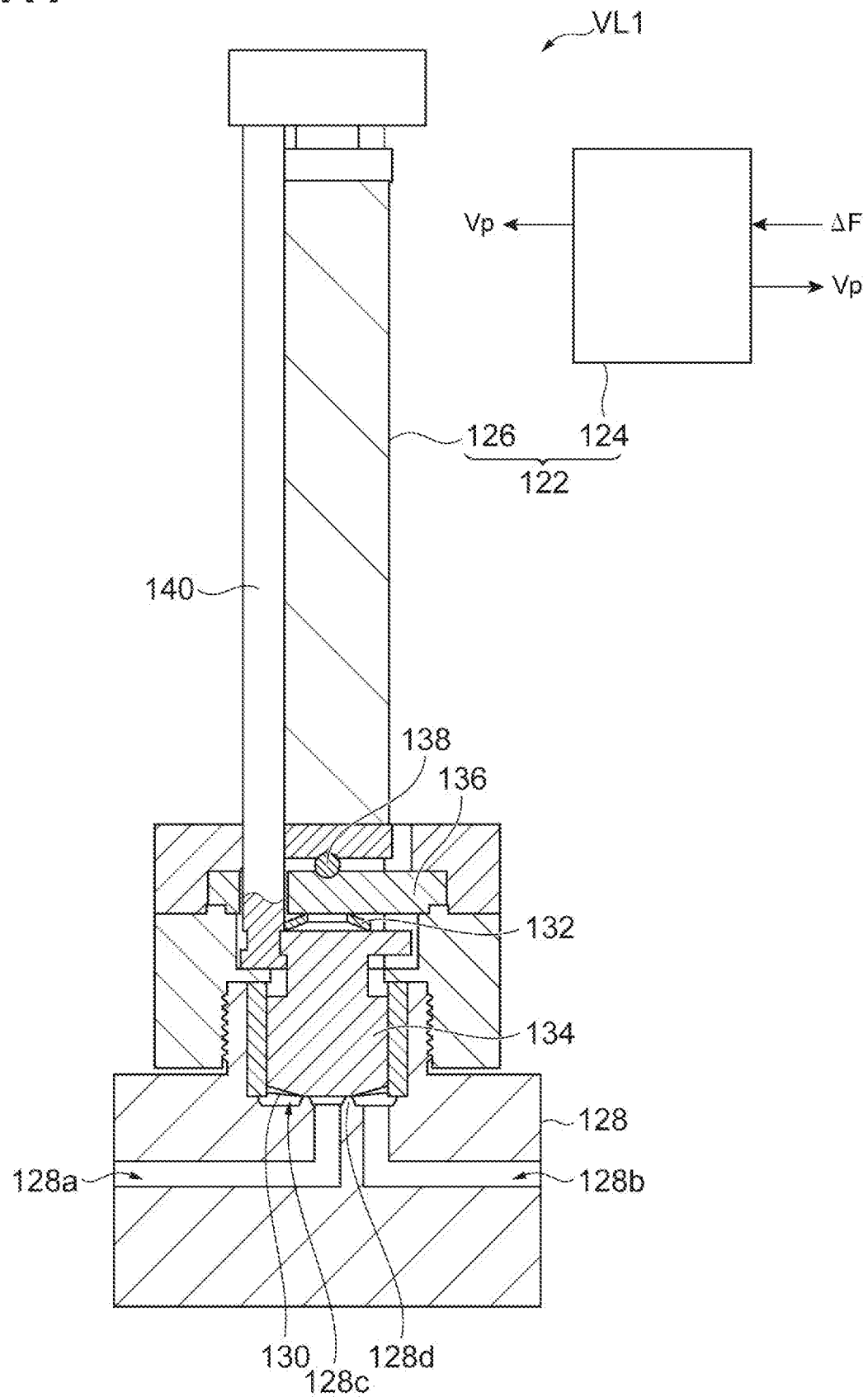
FIG. 17 is a diagram illustrating an example of a configuration of a control valve.

In addition, in the above-described embodiment, the above-described control valve VL1 can be used in the switching confirmation of the switching valve VL2. FIG. 17 is a diagram illustrating an example of a configuration of the control valve VL1. As shown in FIG. 17, the control valve VL1 includes a driving portion 122. This driving portion 122 includes a control circuit 124. A flow rate difference ΔF between the output flow rate and the set flow rate is input to the control circuit 124 from the above-described control circuit C2.

In addition, the driving portion 122 includes a piezoelectric element 126 (piezoelectric element). The piezoelectric element 126 is configured to move a valve body 130 described later in the switching operation of the control valve VL1. The piezoelectric element 126 expands in accordance with an applied voltage (an example of a control voltage), and performs switching of the control valve VL1 by the valve body 130 and a valve seat 128d described later being brought close to or separated from each other. For example, the control circuit 124 is configured to control an applied voltage Vp which is a voltage applied to the piezoelectric element 126 so that the flow rate difference ΔF is set to 0. Meanwhile, the control circuit 124 is configured to input a signal for specifying the applied voltage Vp to the piezoelectric element to the control circuit C2. That is, the control circuit C2 functions as a control unit that acquires a signal (control value of the control valve VL1) for specifying the applied voltage Vp to the piezoelectric element.

The control valve VL1 further includes a main body 128, a valve body 130 (diaphragm), a disc spring 132, a pressing member 134, a base member 136, a spherical body 138, and a support member 140. The main body 128 provides a flow channel 128a, a flow channel 128b, and a valve chest 128c. The flow channel 128a and the flow channel 128b constitutes a portion of the above-described second flow channel L2. In addition, the main body 128 further provides a valve seat 128d.

The valve body 130 is urged against the valve seat 128d by the disc spring 132 through the pressing member 134. In a case where the applied voltage to the piezoelectric element 126 is zero, the valve body 130 is in contact with the valve seat 128d, and the control valve VL1 is set to be in a closed state.

One end (lower end in the drawing) of the piezoelectric element 126 is supported by the base member 136. The piezoelectric element 126 is coupled to the support member 140. The support member 140 is coupled to the pressing member 134 on one end thereof (lower end in the drawing). In a case where a voltage is applied to this piezoelectric element 126, the piezoelectric element 126 expands. In a case where the piezoelectric element 126 expands, the support member 140 moves in a direction away from the valve seat 128d, and the pressing member 134 also move in the direction away from the valve seat 128d accordingly. Thereby, the valve body 130 is separated from the valve seat 128d, and the control valve VL1 is set to be in an opened state. The degree of opening of the control valve VL1, that is, a distance between the valve body 130 and the valve seat 128d is controlled by a voltage which is applied to the piezoelectric element 126.

Here, the control circuit C2 can determine switching of the switching valve VL2 on the basis of the applied voltage of the piezoelectric element 126. FIG. 18 is a diagram illustrating the switching confirmation of the switching valve. Here, (A) of FIG. 18 is a recipe of gas supply, (B) of FIG. 18 is a switching timing of the switching valve VL2, (C) of FIG. 18 is a detection value of the pressure detector PM, and (D) of FIG. 18 is a control voltage of the piezoelectric element of the control valve VL1. In a case of the recipe as shown in (A) of FIG. 18, the "open timing" of the switching valve VL2 becomes the same as the timing of "gas ON" of the recipe as shown in (B) of FIG. 18. As shown in (C) of FIG. 18, the detection value of the pressure detector PM is set to a constant value regardless of switching of the switching valve VL2. Such a situation of constant pressure is realized by the switching of the control valve VL1, that is, the operation of the piezoelectric element 126. The control voltage of the piezoelectric element 126 changes from a voltage value $V_{P1}$ to a voltage value $V_{P2}$ at time $T_{P1}$ when the switching valve VL2 is set to be opened, and changes from the voltage value $V_{P2}$ to the voltage value $V_{P1}$ at time $T_{P2}$ when the switching valve VL2 is set to be closed. Similarly, the control voltage of the piezoelectric element 126 changes from the voltage value $V_{P1}$ to the voltage value $V_{P2}$ at time $T_{P3}$ when the switching valve VL2 is set to be opened, and changes from the voltage value $V_{P2}$ to the voltage value $V_{P1}$ at time $T_{P4}$ when the switching valve VL2 is set to be closed. The control circuit C2 determines a change in the control voltage of the piezoelectric element 126, and thus can determine the switching of the switching valve VL2. Thus, it is possible to easily determine the switching of the switching valve VL2 without adding a sensor or the like.

The control circuit C2 may compare the acquired control voltage with the reference value of a predetermined control voltage, and output a warning in accordance with the comparison result. The reference value of a predetermined control voltage refers to, for example, the control voltage of the piezoelectric element 126 operated when created according to the recipe. The reference value of the measured control voltage is previously stored in a storage unit capable of being referred to by the control circuit C2. The control circuit C2 acquires the reference value by referring to the storage unit, and performs comparison with the acquired control voltage. The comparison result refers to, for example, a difference between the acquired control voltage and the reference value of a predetermined control voltage. The control circuit C2 outputs a warning, for example, in a case where the difference is equal to or greater than a predetermined threshold. The control circuit C2 outputs a warning signal to, for example, a display or a speaker. Thereby, it is possible to output a warning when the switching valve does not perform a predetermined operation.

EXAMPLES

Hereinafter, examples and comparative examples carried out by the inventor will be set forth in order to describe the above effects, however, the present disclosure is not limited the following examples.

(Validation of Detection Position of Pressure Detector PM)

It was verified whether the detection position of the pressure detector PM that detects pressure in the flow channel between the control valve and the orifice influences the flow rate control. Initially, it was confirmed whether a positional relationship between the pressure detector PM and the orifice influences the flow rate control. FIGS. 19A and 19B are system schematic diagrams when the influence of the detection position of the pressure detector PM on the flow rate control is evaluated. As shown in FIG. 19A, an evaluation system includes a flow rate reference device FC2, a control valve VL7, the pressure detector PM, an orifice OL5 and a switching valve VL8. The flow rate reference device FC2 has the same configuration as that of the pressure type flow rate control apparatus FC1. As an evaluation method, as shown in FIG. 19B, a distance from the orifice OL5 to the pressure detector PM is set to a separation distance LL1, and the separation distance LL1 is changed in a range of 0 [m] to 3 [m], to evaluate an error between the set value and the flow rate on the outlet side of the orifice OL5. The results are shown in FIG. 20.

Figure 20:
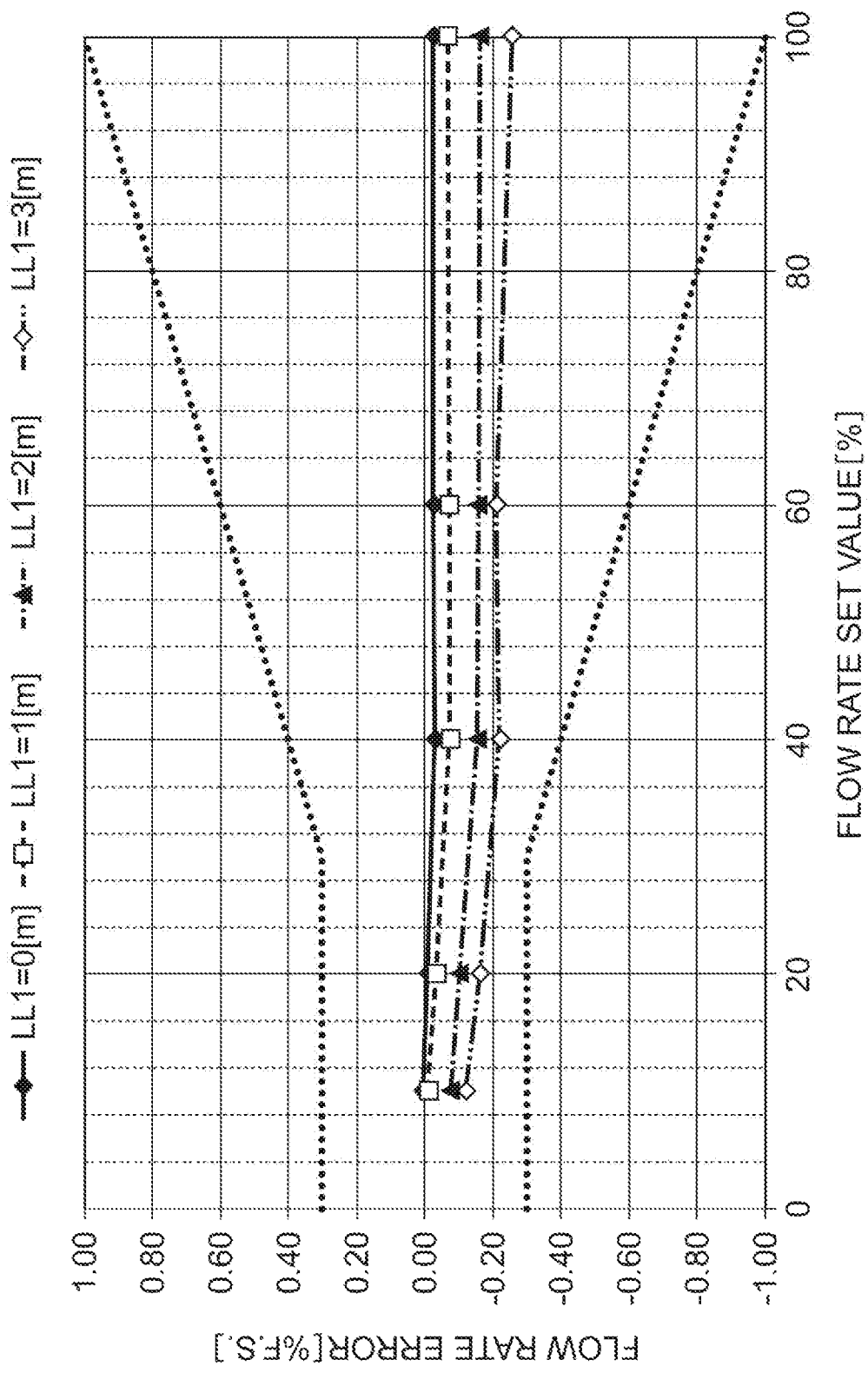
FIG. 20 is evaluation results evaluated in the system configuration of FIGS. 19A and 19B.

FIG. 20 shows evaluation results evaluated in the system configuration of FIGS. 19A and 19B. The horizontal axis is a flow rate set value [%], and the vertical axis is a flow rate error [%]. The flow rate set value is a ratio of a flow rate capable of flowing through the orifice OL5 to a maximum value. The flow rate error was measured in a case where the separation distance LL1 is 0 [m], a case where the separation distance LL1 is 1 [m], a case where the separation distance LL1 is 2 [m], and a case where the separation distance LL1 is 3 [m], and the results were plotted. The broken line in the drawing is the standard specification value of the orifice. As shown in FIG. 20, it was confirmed that, as the separation distance LL1 becomes larger, the absolute value of the flow rate error increases. This is considered because the degree of accuracy drops by the differential pressure of the length of piping between the orifice OL5 and the pressure detector PM.

Next, it was confirmed whether a positional relationship between the pressure detector PM and the control valve influences the flow rate control. FIGS. 21A and 21B are system schematic diagrams when the influence of the detection position of the pressure detector PM on the flow rate control is evaluated. As shown in FIG. 21A, an evaluation system includes the flow rate reference device FC2, the control valve VL7, the pressure detector PM, the orifice OL5 and the switching valve VL8. The flow rate reference device FC2 has the same configuration as that of the pressure type flow rate control apparatus FC1. As an evaluation method, as shown in FIG. 21B, a distance from the pressure detector PM to the control valve VL7 is set to a separation distance LL2, and the separation distance LL2 is changed in a range of 0 [m] to 3 [m], to evaluate an error between the set value and the flow rate on the outlet side of the orifice OL5. The results are shown in FIG. 22.

Figure 22:
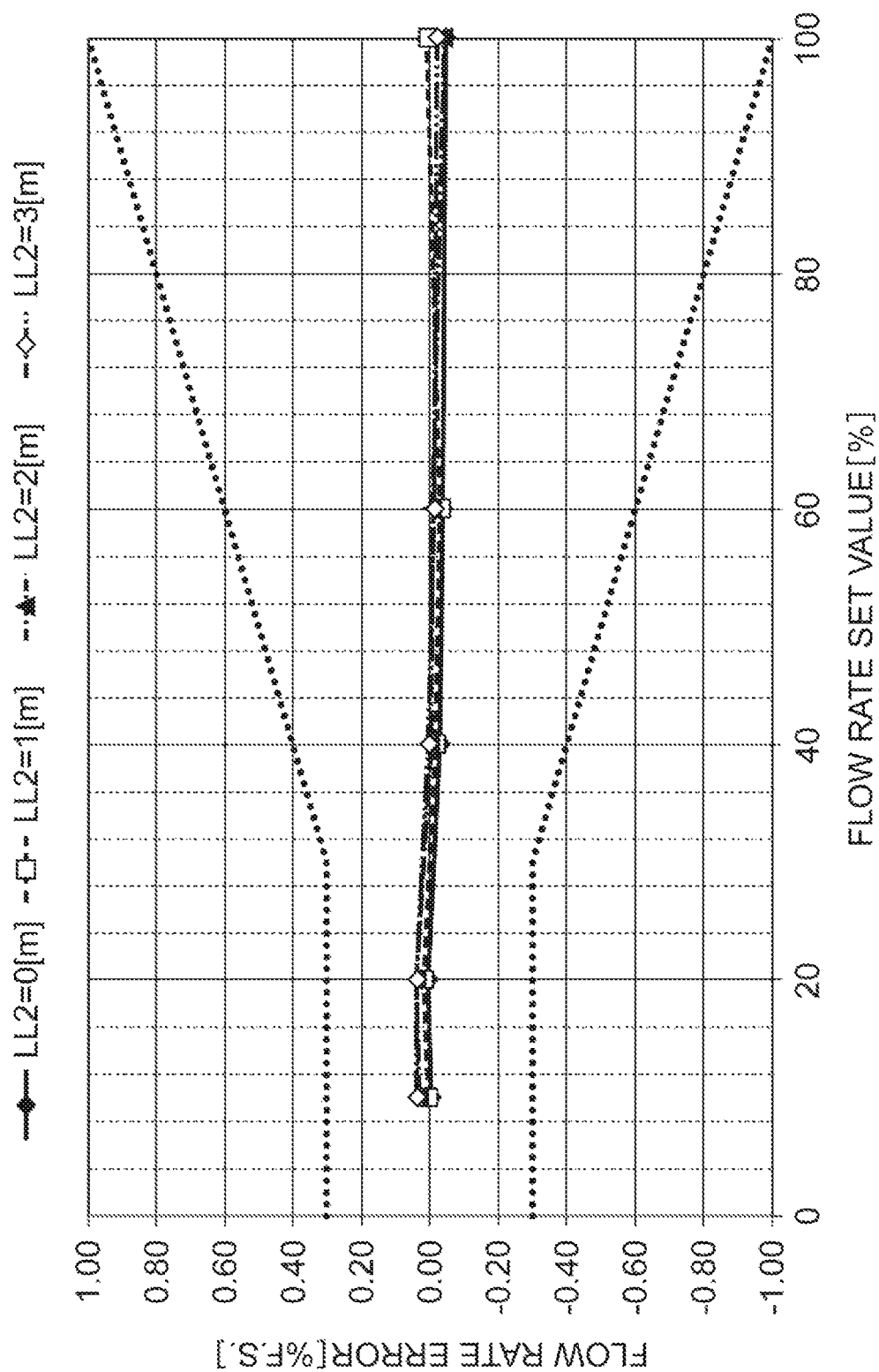
FIG. 22 is evaluation results evaluated in the system configuration of FIGS. 21A and 21B.

FIG. 22 shows evaluation results evaluated in the system configuration of FIGS. 21A and 21B. The horizontal axis is a flow rate set value [%], and the vertical axis is a flow rate error [%]. The flow rate set value is a ratio of a flow rate capable of flowing through the orifice OL5 to a maximum value. Flow rate error was measured in a case where the separation distance LL2 is 0 [m], a case where the separation distance LL2 is 1 [m], a case where the separation distance LL2 is 2 [m], and a case where the distance between the pressure detector PM and the control valve VL7 is 3 [m], and the results were plotted. The broken line in the drawing is the standard specification value of the flow rate reference device FC2. As shown in FIG. 22, it was confirmed that the flow rate error is not dependent on the length of piping between the pressure detector PM and the control valve VL7. From the results of FIGS. 20 and 22, it was confirmed that the location of the pressure detector PM on the orifice side in the flow channel between the control valve and the orifice can allow the flow rate control to be accurately performed. In addition, it was confirmed that the length of piping between the orifice OL5 and the pressure detector PM is required to be set to be equal to or less than 1 [m] in order to set the flow channel error to be equal to or less than 0.1[%].

(Validation of Detection Position of Temperature Detector TM)

Figure 23:
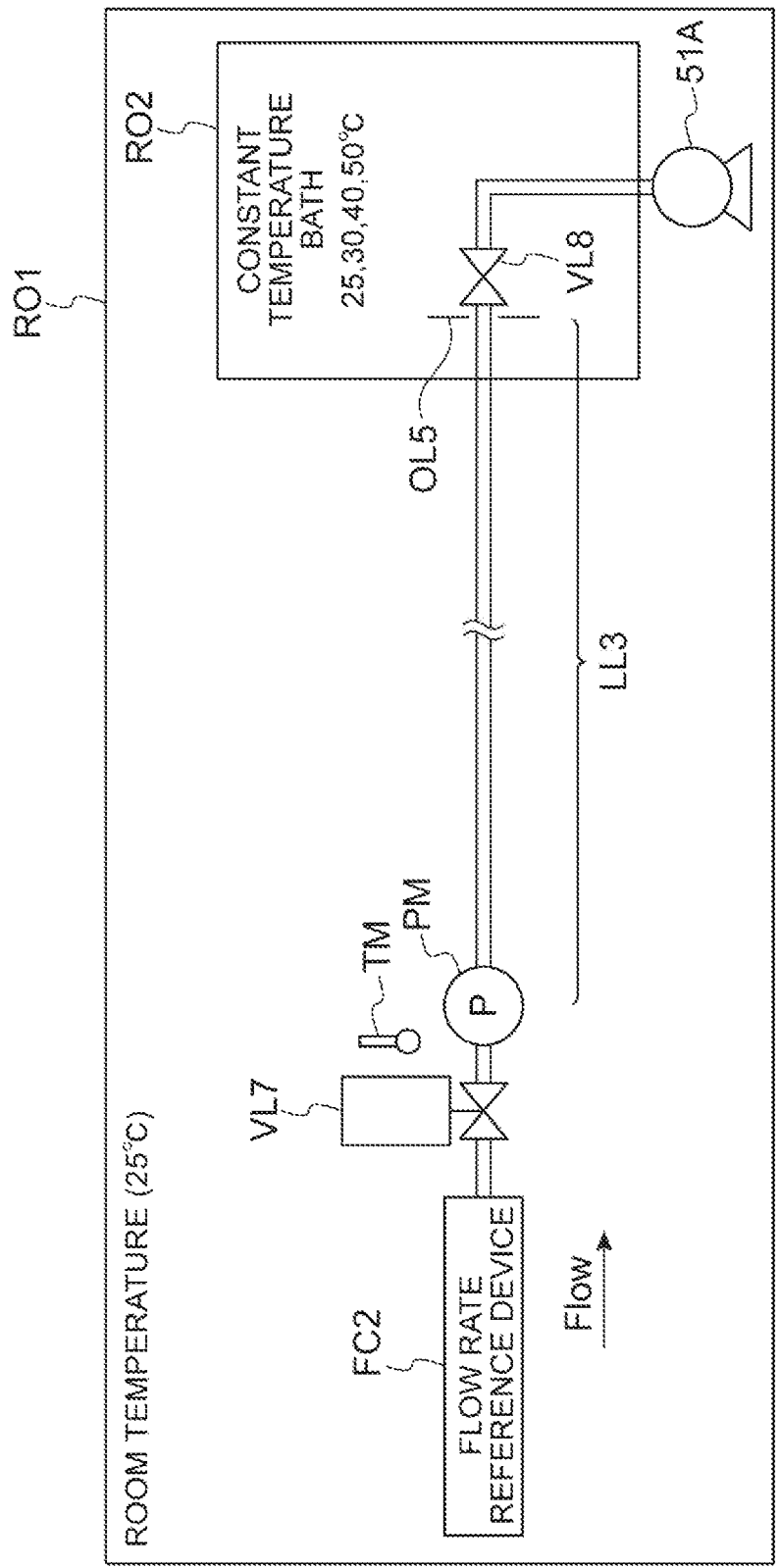
FIG. 23 is a system schematic diagram when the influence of the detection position of a temperature detector on flow rate control is evaluated.

It was verified whether the detection position of the temperature detector TM that detects temperature in the flow channel between the control valve and the orifice influences the flow rate control. FIG. 23 is a system schematic diagram when the influence of the detection position of the temperature detector TM on the flow rate control is evaluated. As shown in FIG. 19A, the evaluation system is disposed within a measurement chamber RO1 of room temperature (25° C.), and includes the flow rate reference device FC2, the control valve VL7, the pressure detector PM, the temperature detector TM, the orifice OL5 and the switching valve VL8. The flow rate reference device FC2 has the same configuration as that of the pressure type flow rate control apparatus FC1. The temperature detector TM was disposed on the control valve VL1 side, and was used for the flow rate control of the control valve VL1. The orifice OL5 and the switching valve VL8 were disposed in a constant temperature bath RO2 capable of controlling temperature in a range of 25° C. to 50° C. Temperature was changed in the constant temperature bath RO2, and a relationship between the set value and the flow rate on the outlet side of the orifice OL5 was evaluated. A separation distance LL3 between the pressure detector PM and the orifice OL5 is set to 2 [m]. The results are shown in FIGS. 24 and 25.

Figure 24:
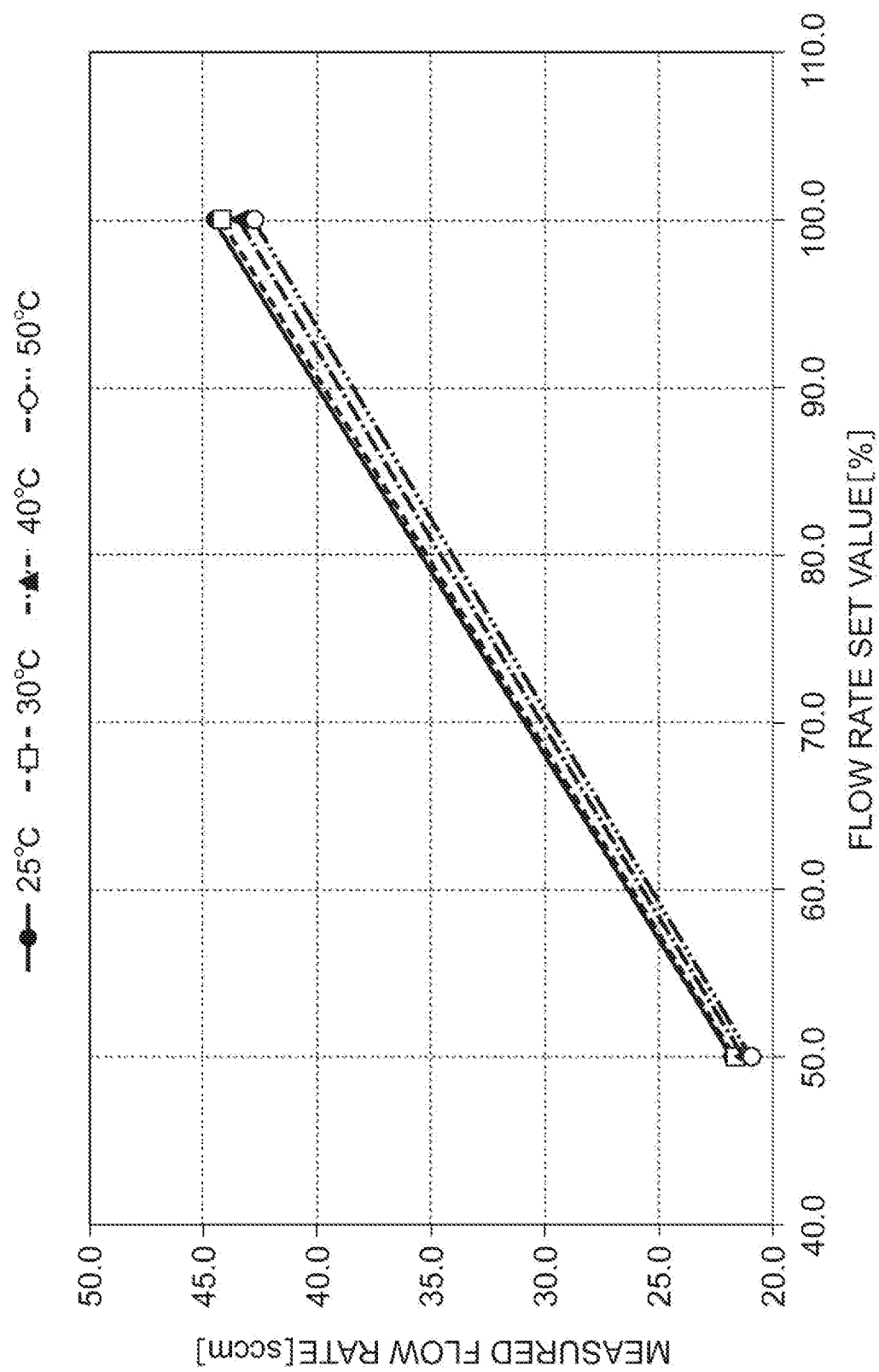
FIG. 24 is evaluation results evaluated in the system configuration of FIG. 23.
Figure 25:
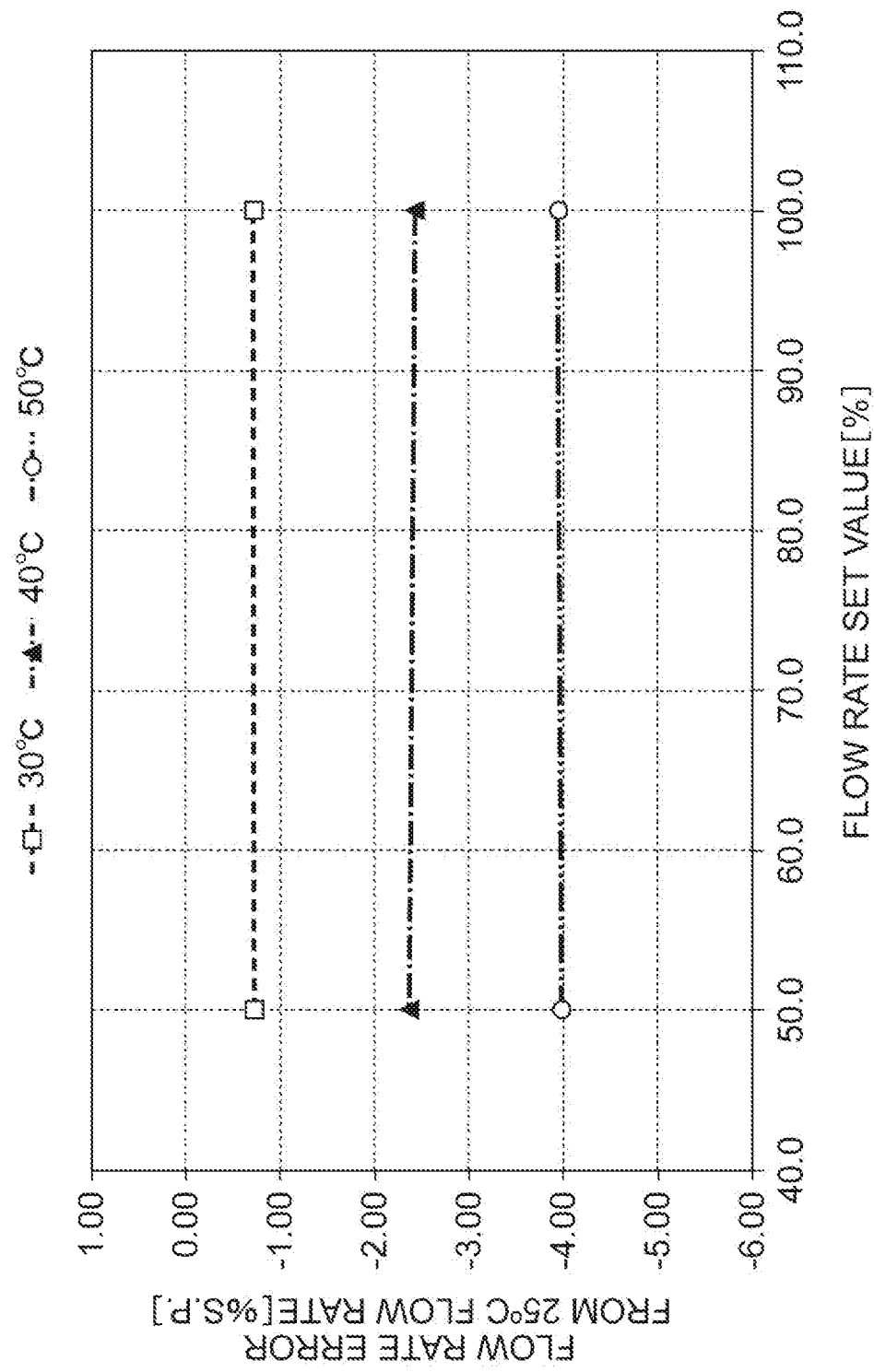
FIG. 25 is results obtained by converting the graph of FIG. 24 on the basis of data of 25° C. of FIG. 24.

FIG. 24 shows evaluation results evaluated in the system configuration of FIG. 23. The horizontal axis is a flow rate set value [%], and the vertical axis is a measured flow rate [sccm] on the outlet side of the orifice OL5. The flow rate set value is a ratio of a flow rate capable of flowing through the orifice OL5 to a maximum value. In each case where the set temperatures of the constant temperature bath RO2 are 25° C., 30° C., 40° C., and 50° C., the set value and the flow rate on the outlet side of the orifice OL5 were plotted. FIG. 25 shows results obtained by converting the graph of FIG. 24 on the basis of data of 25° C. in FIG. 24. The horizontal axis is a flow rate set value [%], and the vertical axis is a value based on the flow rate of 25° C. As shown in FIG. 25, it was confirmed that as a difference between the temperature of the orifice OL5 and the detected temperature (25° C.) of the temperature detector TM becomes larger, the absolute value of the flow rate error increases. In this manner, it was confirmed that it is important to accurately measure the temperature of the orifice. From the results of FIG. 24 and FIG. 25, it was confirmed that the location of the temperature detector TM on the orifice side in the flow channel between the control valve and the orifice can allow the flow rate control to be accurately performed.

(Validation of Influence of Each Component of Semiconductor Manufacturing System on Flow Rate Control)

Figure 26:
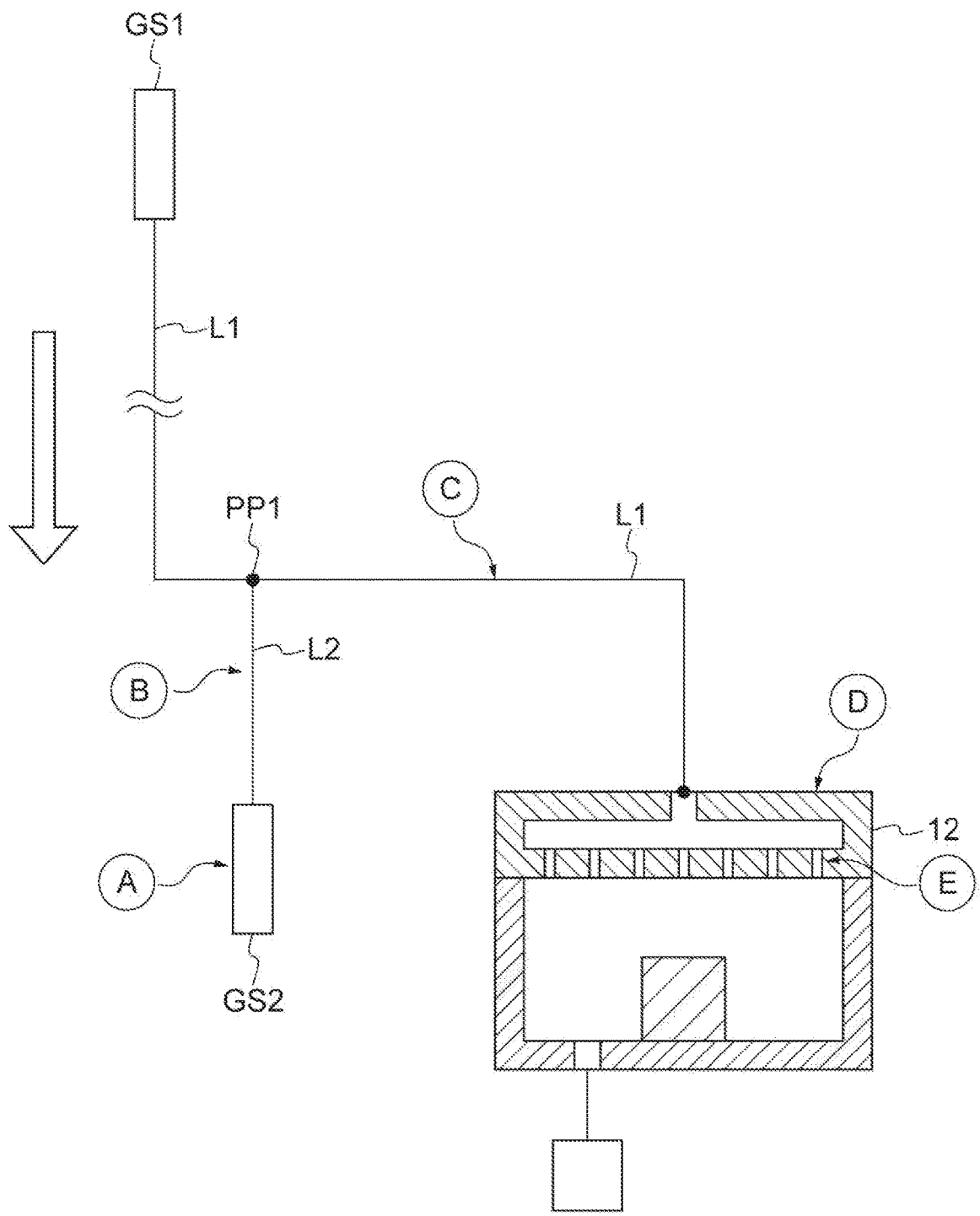
FIG. 26 is a schematic diagram illustrating components for which an influence on flow rate control has been evaluated.

The influence of components of a semiconductor manufacturing system including the gas supply system on the flow rate control was evaluated. FIG. 26 is a schematic diagram illustrating components for which an influence on the flow rate control has been evaluated. A flow rate control device is omitted. A system shown in FIG. 26 includes the first gas source GS1, the second gas source GS2 and the chamber 12. The first gas source GS1 is connected to the chamber 12 through the first flow channel L1. The second gas source GS2 is connected to the second flow channel L2. The second flow channel L2 is merged into the first flow channel L1 at the connection point PP1.

An evaluation method was as follows. An Ar gas was used as the first gas, and was continuously supplied to the chamber 12 at 750 [sccm]. In addition, an $O_2$ gas was used as the second gas, and was intermittently supplied to the chamber 12 at 5 [sccm]. Plasma was generated within the chamber 12, and the emission intensity of the plasma was measured. The measured emission intensity was normalized on the basis of maximum emission intensity. A time (evaluation during rising) taken until the measured emission intensity rises from 0% up to 90% by supplying a gas and a time (evaluation during falling) taken until the measured emission intensity falls from 100% down to 20% by stopping gas supply were measured, and responsiveness was confirmed.

Evaluation areas were set as follows. An area A is a flow rate control device. Regarding the flow rate control device, an example in which the orifice OL1 and the switching valve VL2 are included and a pressure type flow rate control apparatus FC3 of a gas supply system 1 shown in FIG. 29 were set as targets for evaluation. An area B is a length (Add Line length) from the flow rate control device to the connection point PP1. Regarding the Add Line length, the example (Add Line length of 0 [m]) in which the orifice OL1 and the switching valve VL2 are included and a comparative example of Add Line lengths of 0.15 [m], 1.00 [m], and 3.00 [m] are set as targets for evaluation. An area C is a length (Main Line length) from the first gas source GS1 to the chamber 12, and cases of 0.15 [m], 1.00 [m], and 3.00 [m] were evaluated. An area D is an upper electrode capacity, and cases of 100 [cc], 160 [cc], and 340 [cc] were evaluated. An area E is the number of GAS holes, and cases of 53 and 105 were evaluated. The results are shown in FIG. 27.

FIG. 27 shows evaluation results of each component shown in FIG. 26. The areas A to C surrounded by broken lines are portions equivalent to areas included in the gas supply system according to the embodiment. Regarding the area A, it was confirmed that the example has more excellent responsiveness than the comparative example in the evaluation during rising. That is, it is confirmed that the example in which the orifice OL1 and the switching valve VL2 are included has more excellent responsiveness than the pressure type flow rate control apparatus FC3 of the gas supply system 1 shown in FIG. 29. In addition, regarding the area B, the case where the Add Line length is 0 [m] has most excellent responsiveness in both the evaluation during rising and the evaluation during falling. That is, it was confirmed that the responsiveness of the example in which the orifice OL1 and the switching valve VL2 are included is excellent. In addition, regarding the area C and the area E, it was confirmed that the area dependency of responsiveness is small. In addition, regarding the area D, it was confirmed that as the upper electrode capacity becomes smaller, responsiveness becomes more excellent.

The degree of influence of each area was calculated. The degree of influence shows a ratio of the degree of the influence of each area to the degree of the entire influence. As shown in FIG. 27, it was confirmed that the area B among the areas A to E is an area having the most influence. That is, it was confirmed that since the configuration of the example in which the orifice OL1 and the switching valve VL2 are included can control parameters of the area having the most influence, the configuration is considerably effective in enhancing responsiveness.

Meanwhile, the above measurements are results during Ar gas supply, that is, in a case where a carrier gas is present. For example, as in the gas supply system 1B shown in FIG. 9, the carrier gas may not be supplied in some cases. In such cases, the Main Line length dependency of responsiveness tends to increase. Therefore, the orifice OL1 and the switching valve VL2 may be disposed further upstream than the inlet block 55 in a case where there is a step in which the carrier gas is used in the recipe, and the orifice OL1 and the switching valve VL2 may be disposed further downstream than the inlet block 55 in a case where there is no step in which the carrier gas is used in the recipe. That is, the positions of the orifice OL1 and the switching valve VL2 with respect to the inlet block 55 may be determined in accordance with the recipe.

What is claimed is:

1. A gas supply system for supplying a gas to a chamber of a substrate processing apparatus, the system comprising:
    a first flow channel connecting a first gas source of a first gas and the chamber;
    a second flow channel connecting a second gas source of a second gas and the first flow channel;
    a control valve, provided in the second flow channel, configured to control a flow rate of the second gas to a predetermined amount;
    an orifice provided downstream of the control valve and at a terminus of the second flow channel;
    a switching valve, provided at a connection point between the first flow channel and the terminus of the second flow channel, configured to control a supply timing of the second gas which is supplied from an outlet of the orifice to the first flow channel;
    an exhaust mechanism, connected to a flow channel between the control valve and the orifice in the second flow channel, configured to exhaust the second gas; and
    a controller configured to bring the control valve, the switching valve and the exhaust mechanism into operation.

2. The gas supply system according to claim 1, wherein the switching valve includes a sealing member which is pressed against the orifice so as to seal the outlet of the orifice at the time of closing control, and is separated from the orifice at the time of opening control.

3. The gas supply system according to claim 2, wherein the switching valve includes:
    a cylinder configured to fixedly support the sealing member,
    an urging member configured to elastically urge the cylinder in a direction in which the sealing member is pressed against the orifice, and
    a driving portion configured to move the cylinder in a direction opposite to the pressed direction.

4. The gas supply system according to claim 1, wherein the orifice and the switching valve are disposed further downstream than an inlet block provided to the chamber.

5. The gas supply system according to claim 1, wherein the orifice and the switching valve are disposed further upstream than the inlet block provided to the chamber.

6. The gas supply system according to claim 1, wherein the exhaust mechanism includes:
    a small exhaust flow channel, connected to the second flow channel, which has a first amount of exhaust;
    a large exhaust flow channel, connected to the second flow channel, which has a second amount of exhaust larger than the first amount of exhaust; and
    a first exhaust valve, provided in the large exhaust flow channel, configured to control an exhaust timing.

7. The gas supply system according to claim 6, wherein the exhaust mechanism further includes a second exhaust valve, provided in the small exhaust flow channel, configured to control an exhaust timing.

8. The gas supply system according to claim 1, wherein the exhaust mechanism is connected to the orifice side in the flow channel between the control valve and the orifice.

9. The gas supply system according to claim 1, further comprising a pressure detector configured to detect a pressure of the second gas in the flow channel between the control valve and the orifice in the second flow channel,
    wherein the pressure detector is located on the orifice side in the flow channel between the control valve and the orifice, and
    the control valve controls the flow rate of the second gas on the basis of a detection result of the pressure detector.

10. The gas supply system according to claim 1, further comprising a temperature detector configured to detect a temperature of the second gas in the flow channel between the control valve and the orifice in the second flow channel,
    wherein the temperature detector is located on the orifice side in the flow channel between the control valve and the orifice, and
    the control valve controls the flow rate of the second gas on the basis of a detection result of the temperature detector.

11. The gas supply system according to claim 1, wherein in a case where the second gas of a target flow rate is supplied to the first flow channel at a target supply timing,
    the controller controls the control valve to circulate the second gas of the target flow rate in a state where the exhaust mechanism is brought into operation while the switching valve is set to be closed in a predetermined period until arrival at the target supply timing, and sets the switching valve to be opened at the time of arrival at the target supply timing.

12. The gas supply system according to claim 1, further comprising a control unit configured to acquire a control value of the control valve,
    wherein the control valve includes
        a valve body,
        a valve seat, and
        a piezoelectric element configured to expand in accordance with a control voltage and perform switching of the control valve by the valve body and the valve seat being brought close to or separated from each other, and
    the control unit determines switching of the switching valve on the basis of a control voltage of the piezoelectric element.

13. The gas supply system according to claim 12, wherein the control unit compares the acquired control voltage with a reference value of the predetermined control voltage, and outputs a warning in accordance with a comparison result.

14. A substrate processing system comprising the gas supply system according to claim 1.

15. A method for supplying a gas to a chamber of a substrate processing apparatus using a gas supply system including
- a first flow channel connecting a first gas source of a first gas and the chamber,
- a second flow channel connecting a second gas source of a second gas and the first flow channel,
- a control valve, provided in the second flow channel, configured to control a flow rate of the second gas to a predetermined amount,
- an orifice provided downstream of the control valve and at a terminus of the second flow channel,
- a switching valve, provided at a connection point between the first flow channel and the terminus of the second flow channel, configured to control a supply timing of the second gas which is supplied from an outlet of the orifice to the first flow channel,
- an exhaust mechanism, connected to a flow channel between the control valve and the orifice in the second flow channel, configured to exhaust the second gas, and
- a controller configured to bring the control valve, the switching valve and the exhaust mechanism into operation, the method comprising the steps of:
controlling the control valve to circulate the second gas of a target flow rate in a state where the exhaust mechanism is brought into operation while the switching valve is set to be closed; and
setting the switching valve to be opened and supplying the second gas of the target flow rate to the first flow channel at the time of arrival at a target supply timing during continuation of the step of controlling.

* * * * *